(12) United States Patent
Shanmugasundram et al.

(10) Patent No.: US 7,047,099 B2
(45) Date of Patent: May 16, 2006

(54) INTEGRATING TOOL, MODULE, AND FAB LEVEL CONTROL

(75) Inventors: Arulkumar P. Shanmugasundram, Sunnyvale, CA (US); Alexander T. Schwarm, Austin, TX (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/173,108

(22) Filed: Jun. 18, 2002

(65) Prior Publication Data

US 2002/0193902 A1 Dec. 19, 2002

Related U.S. Application Data

(60) Provisional application No. 60/298,878, filed on Jun. 19, 2001, provisional application No. 60/365,770, filed on Mar. 21, 2002.

(51) Int. Cl.
*G06F 19/00* (2006.01)
(52) U.S. Cl. ..................... 700/121; 700/19; 700/31; 438/5
(58) Field of Classification Search ................ 700/19, 700/31, 51, 121; 438/5, 17
See application file for complete search history.

(56) References Cited

U.S. PATENT DOCUMENTS

| | | | |
|---|---|---|---|
| 3,205,485 | A | 9/1965 | Noltingk |
| 3,229,198 | A | 1/1966 | Libby |
| 3,767,900 | A | 10/1973 | Chao et al. |
| 3,920,965 | A | 11/1975 | Sohrwardy |
| 4,000,458 | A | 12/1976 | Miller et al. |
| 4,207,520 | A | 6/1980 | Flora et al. |
| 4,209,744 | A | 6/1980 | Gerasimov et al. |
| 4,302,721 | A | 11/1981 | Urbanek et al. |
| 4,368,510 | A | 1/1983 | Anderson |

(Continued)

FOREIGN PATENT DOCUMENTS

CA 2050247 8/1991

(Continued)

OTHER PUBLICATIONS

Hu, Albert, Kevin Nguyen, Steve Wong, Xiuhua Zhang, Emanuel Sachs, and Peter Renteln. 1993. "Concurrent Deployment of Run by Run Controller Using SCC Framework." IEEE/SEMI International Semiconductor Manufacturing Science Symposium. pp. 126-132.

(Continued)

*Primary Examiner*—Albert W. Paladini
*Assistant Examiner*—Sean Shechtman
(74) *Attorney, Agent, or Firm*—Wilmer Cutler Pickering Hale and Dorr

(57) ABSTRACT

Semiconductor wafers are processed in a fab in a manner that integrates control at multiple functional unit levels. Examples of functional units include fabs, modules, tools, and the like. Initially, a number of functional unit property targets are received at a functional unit. The functional unit property targets are utilized to generate a number of tool targets for any number of tool level functional units. From there, the tool targets are forwarded to the corresponding tool level functional units. At these tool level functional units, a number of tool recipes, each of which define a number of process setpoints, may be generated by processing the tool targets. The process setpoints define a number of parameters which must be satisfied in order to attain the corresponding tool targets. In addition, in at least some embodiments, the tool targets and tool recipes are determined utilizing feedback information including functional unit states and measurements of controlled parameters.

46 Claims, 8 Drawing Sheets

U.S. PATENT DOCUMENTS

| | | |
|---|---|---|
| 4,609,870 A | 9/1986 | Lale et al. |
| 4,616,308 A | 10/1986 | Morshedi et al. |
| 4,663,703 A | 5/1987 | Axelby et al. |
| 4,698,766 A | 10/1987 | Entwistle et al. |
| 4,750,141 A | 6/1988 | Judell et al. |
| 4,755,753 A | 7/1988 | Chern |
| 4,757,259 A | 7/1988 | Charpentier |
| 4,796,194 A | 1/1989 | Atherton |
| 4,938,600 A | 7/1990 | Into |
| 4,957,605 A | 9/1990 | Hurwitt et al. |
| 4,967,381 A | 10/1990 | Lane et al. |
| 5,014,208 A | 5/1991 | Wolfson |
| 5,089,970 A | 2/1992 | Lee et al. |
| 5,108,570 A | 4/1992 | Wang |
| 5,128,588 A | 7/1992 | Kameya et al. |
| 5,208,765 A | 5/1993 | Turnbull |
| 5,220,517 A | 6/1993 | Sierk et al. |
| 5,226,118 A | 7/1993 | Baker et al. |
| 5,231,585 A | 7/1993 | Kobayashi et al. |
| 5,236,868 A | 8/1993 | Nulman |
| 5,240,552 A | 8/1993 | Yu et al. |
| 5,260,868 A | 11/1993 | Gupta et al. |
| 5,270,222 A | 12/1993 | Moslehi |
| 5,283,141 A | 2/1994 | Yoon et al. |
| 5,295,242 A | 3/1994 | Mashruwala et al. |
| 5,305,221 A | 4/1994 | Atherton |
| 5,309,221 A | 5/1994 | Fischer et al. |
| 5,329,463 A | 7/1994 | Sierk et al. |
| 5,338,630 A | 8/1994 | Yoon et al. |
| 5,347,446 A | 9/1994 | Iino et al. |
| 5,367,624 A | 11/1994 | Cooper |
| 5,369,544 A | 11/1994 | Mastrangelo |
| 5,375,064 A | 12/1994 | Bollinger |
| 5,398,336 A | 3/1995 | Tantry et al. |
| 5,402,367 A * | 3/1995 | Sullivan et al. ................. 703/6 |
| 5,408,405 A | 4/1995 | Mozumder et al. |
| 5,410,473 A | 4/1995 | Kaneko et al. |
| 5,420,796 A | 5/1995 | Weling et al. |
| 5,427,878 A | 6/1995 | Corliss |
| 5,444,632 A | 8/1995 | Kline et al. |
| 5,444,837 A | 8/1995 | Bomans et al. |
| 5,469,361 A | 11/1995 | Moyne |
| 5,485,082 A | 1/1996 | Wisspeintner et al. |
| 5,490,097 A | 2/1996 | Swenson et al. |
| 5,495,417 A | 2/1996 | Fuduka et al. |
| 5,497,316 A | 3/1996 | Sierk et al. |
| 5,497,381 A | 3/1996 | O'Donoghue et al. |
| 5,503,707 A | 4/1996 | Maung et al. |
| 5,508,947 A | 4/1996 | Sierk et al. |
| 5,511,005 A | 4/1996 | Abbe et al. |
| 5,519,605 A | 5/1996 | Cawlfield |
| 5,525,808 A | 6/1996 | Irie et al. |
| 5,526,293 A | 6/1996 | Mozumder et al. |
| 5,534,289 A | 7/1996 | Bilder et al. |
| 5,541,510 A | 7/1996 | Danielson |
| 5,546,312 A | 8/1996 | Mozumder et al. |
| 5,546,326 A | 8/1996 | Tai et al. |
| 5,553,195 A | 9/1996 | Meijer |
| 5,586,039 A | 12/1996 | Hirsch et al. |
| 5,599,423 A | 2/1997 | Parker et al. |
| 5,602,492 A | 2/1997 | Cresswell et al. |
| 5,603,707 A | 2/1997 | Trombetta et al. |
| 5,617,023 A | 4/1997 | Skalski |
| 5,617,321 A | 4/1997 | Frizelle et al. |
| 5,627,083 A | 5/1997 | Tounai |
| 5,629,216 A | 5/1997 | Wijaranakula et al. |
| 5,642,296 A | 6/1997 | Saxena |
| 5,646,870 A | 7/1997 | Krivokapic et al. |
| 5,649,169 A | 7/1997 | Berezin et al. |
| 5,654,903 A | 8/1997 | Reitman et al. |
| 5,655,951 A | 8/1997 | Meikle et al. |
| 5,657,254 A | 8/1997 | Sierk et al. |
| 5,661,669 A | 8/1997 | Mozumder et al. |
| 5,663,797 A | 9/1997 | Sandhu |
| 5,664,987 A | 9/1997 | Renteln |
| 5,665,199 A | 9/1997 | Sahota et al. |
| 5,665,214 A | 9/1997 | Iturralde |
| 5,666,297 A | 9/1997 | Britt et al. |
| 5,667,424 A | 9/1997 | Pan |
| 5,674,787 A | 10/1997 | Zhao et al. |
| 5,689,432 A | 11/1997 | Blaauw et al. |
| 5,694,325 A | 12/1997 | Fukuda et al. |
| 5,695,810 A | 12/1997 | Dubin et al. |
| 5,698,989 A | 12/1997 | Nulman |
| 5,719,495 A | 2/1998 | Moslehi |
| 5,719,796 A | 2/1998 | Chen |
| 5,735,055 A | 4/1998 | Hochbein et al. |
| 5,740,429 A | 4/1998 | Wang et al. |
| 5,751,582 A | 5/1998 | Saxena et al. |
| 5,754,297 A | 5/1998 | Nulman |
| 5,761,064 A | 6/1998 | La et al. |
| 5,764,543 A | 6/1998 | Kennedy |
| 5,777,901 A | 7/1998 | Berezin et al. |
| 5,781,454 A | 7/1998 | Alexander |
| 5,787,021 A | 7/1998 | Samaha |
| 5,787,269 A | 7/1998 | Hyodo |
| 5,808,303 A | 9/1998 | Schlagheck et al. |
| 5,812,407 A | 9/1998 | Sato et al. |
| 5,823,854 A | 10/1998 | Chen |
| 5,824,599 A | 10/1998 | Schacham-Diamand et al. |
| 5,825,356 A | 10/1998 | Habib et al. |
| 5,825,913 A | 10/1998 | Rostami et al. |
| 5,828,778 A | 10/1998 | Hagi et al. |
| 5,831,851 A | 11/1998 | Eastburn et al. |
| 5,832,224 A | 11/1998 | Fehskens et al. |
| 5,838,595 A | 11/1998 | Sullivan et al. |
| 5,838,951 A | 11/1998 | Song |
| 5,844,554 A | 12/1998 | Geller et al. |
| 5,857,258 A | 1/1999 | Penzes et al. |
| 5,859,777 A | 1/1999 | Yokoyama et al. |
| 5,859,964 A | 1/1999 | Wang et al. |
| 5,859,975 A | 1/1999 | Brewer et al. |
| 5,863,807 A | 1/1999 | Jang et al. |
| 5,867,389 A | 2/1999 | Hamada et al. |
| 5,870,306 A | 2/1999 | Harada |
| 5,871,805 A | 2/1999 | Lemelson |
| 5,883,437 A | 3/1999 | Maruyama et al. |
| 5,889,991 A | 3/1999 | Consolatti et al. |
| 5,903,455 A | 5/1999 | Sharpe, Jr. et al. |
| 5,910,011 A | 6/1999 | Cruse |
| 5,910,846 A | 6/1999 | Sandhu |
| 5,912,678 A * | 6/1999 | Saxena et al. ......... 346/468.09 |
| 5,914,879 A | 6/1999 | Wang et al. |
| 5,916,016 A | 6/1999 | Bothra |
| 5,923,553 A | 7/1999 | Yi |
| 5,930,138 A | 7/1999 | Lin et al. |
| 5,940,300 A | 8/1999 | Ozaki |
| 5,943,237 A | 8/1999 | Van Boxem |
| 5,943,550 A | 8/1999 | Fulford, Jr. et al. |
| 5,960,185 A | 9/1999 | Nguyen |
| 5,960,214 A | 9/1999 | Sharpe, Jr. et al. |
| 5,961,369 A | 10/1999 | Bartels et al. |
| 5,963,881 A | 10/1999 | Kahn et al. |
| 5,975,994 A | 11/1999 | Sandhu et al. |
| 5,978,751 A | 11/1999 | Pence et al. |
| 5,982,920 A | 11/1999 | Tobin, Jr. et al. |
| 6,012,048 A | 1/2000 | Gustin et al. |
| 6,017,771 A | 1/2000 | Yang et al. |
| 6,036,349 A | 3/2000 | Gombar |
| 6,037,664 A | 3/2000 | Zhao et al. |
| 6,041,263 A | 3/2000 | Boston et al. |
| 6,041,270 A | 3/2000 | Steffan et al. |
| 6,054,379 A | 4/2000 | Yau et al. |
| 6,059,636 A | 5/2000 | Inaba et al. |

| | | | | | | |
|---|---|---|---|---|---|---|
| 6,064,759 A | 5/2000 | Buckley et al. | | 6,298,470 B1 | 10/2001 | Breiner et al. |
| 6,072,313 A | 6/2000 | Li et al. | | 6,303,395 B1 | 10/2001 | Nulman |
| 6,077,412 A | 6/2000 | Ting et al. | | 6,304,999 B1 | 10/2001 | Toprac et al. |
| 6,078,845 A | 6/2000 | Friedman | | 6,307,628 B1 | 10/2001 | Lu et al. |
| 6,096,649 A | 8/2000 | Jang | | 6,314,379 B1 | 11/2001 | Hu et al. |
| 6,097,887 A | 8/2000 | Hardikar et al. | | 6,317,643 B1 | 11/2001 | Dmochowski |
| 6,100,195 A | 8/2000 | Chan et al. | | 6,320,655 B1 | 11/2001 | Matsushita et al. |
| 6,108,092 A | 8/2000 | Sandhu | | 6,324,481 B1 | 11/2001 | Atchison et al. |
| 6,112,130 A | 8/2000 | Fukuda et al. | | 6,334,807 B1 | 1/2002 | Lebel et al. |
| 6,113,462 A | 9/2000 | Yang | | 6,336,841 B1 | 1/2002 | Chang |
| 6,114,238 A | 9/2000 | Liao | | 6,339,727 B1 | 1/2002 | Ladd |
| 6,127,263 A | 10/2000 | Parikh | | 6,345,315 B1 | 2/2002 | Mishra |
| 6,128,016 A | 10/2000 | Coelho et al. | | 6,355,559 B1 | 3/2002 | Havemann et al. |
| 6,136,163 A | 10/2000 | Cheung et al. | | 6,360,133 B1 | 3/2002 | Campbell et al. |
| 6,141,660 A | 10/2000 | Bach et al. | | 6,360,184 B1 | 3/2002 | Jacquez |
| 6,143,646 A | 11/2000 | Wetzel | | 6,366,934 B1 | 4/2002 | Cheng et al. |
| 6,148,099 A | 11/2000 | Lee et al. | | 6,368,883 B1 | 4/2002 | Bode et al. |
| 6,148,239 A | 11/2000 | Funk et al. | | 6,368,884 B1 | 4/2002 | Goodwin et al. |
| 6,148,246 A | 11/2000 | Kawazome | | 6,379,980 B1 | 4/2002 | Toprac |
| 6,150,270 A | 11/2000 | Matsuda et al. | | 6,381,564 B1 | 4/2002 | David et al. |
| 6,157,864 A | 12/2000 | Schwenke et al. | | 6,388,253 B1 | 5/2002 | Su |
| 6,159,075 A | 12/2000 | Zhang | | 6,389,491 B1 | 5/2002 | Jacobson et al. |
| 6,159,644 A | 12/2000 | Satoh et al. | | 6,391,780 B1 | 5/2002 | Shih et al. |
| 6,161,054 A | 12/2000 | Rosenthal et al. | | 6,395,152 B1 | 5/2002 | Wang |
| 6,169,931 B1 | 1/2001 | Runnels | | 6,397,114 B1 | 5/2002 | Eryurek et al. |
| 6,172,756 B1 | 1/2001 | Chalmers et al. | | 6,400,162 B1 | 6/2002 | Mallory et al. |
| 6,173,240 B1 | 1/2001 | Sepulveda et al. | | 6,405,096 B1 | 6/2002 | Toprac et al. |
| 6,175,777 B1 | 1/2001 | Kim | | 6,405,144 B1 | 6/2002 | Toprac et al. |
| 6,178,390 B1 | 1/2001 | Jun | | 6,417,014 B1 | 7/2002 | Lam et al. |
| 6,181,013 B1 | 1/2001 | Liu et al. | | 6,427,093 B1 | 7/2002 | Toprac |
| 6,183,345 B1 | 2/2001 | Kamono et al. | | 6,432,728 B1 | 8/2002 | Tai et al. |
| 6,185,324 B1 | 2/2001 | Ishihara et al. | | 6,435,952 B1 | 8/2002 | Boyd et al. |
| 6,191,864 B1 | 2/2001 | Sandhu | | 6,438,438 B1 | 8/2002 | Takagi et al. |
| 6,192,291 B1 | 2/2001 | Kwon | | 6,440,295 B1 | 8/2002 | Wang |
| 6,197,604 B1 | 3/2001 | Miller et al. | | 6,442,496 B1 | 8/2002 | Pasadyn et al. |
| 6,204,165 B1 | 3/2001 | Ghoshal | | 6,449,524 B1 | 9/2002 | Miller et al. |
| 6,210,983 B1 | 4/2001 | Atchison et al. | | 6,455,415 B1 | 9/2002 | Lopatin et al. |
| 6,211,094 B1 | 4/2001 | Jun et al. | | 6,455,937 B1 | 9/2002 | Cunningham |
| 6,212,961 B1 | 4/2001 | Dvir | | 6,465,263 B1 | 10/2002 | Coss, Jr. et al. |
| 6,214,734 B1 | 4/2001 | Bothra et al. | | 6,479,902 B1 | 11/2002 | Lopatin et al. |
| 6,217,412 B1 | 4/2001 | Campbell et al. | | 6,479,990 B1 | 11/2002 | Mednikov et al. |
| 6,219,711 B1 | 4/2001 | Chari | | 6,484,064 B1 | 11/2002 | Campbell |
| 6,222,936 B1 | 4/2001 | Phan et al. | | 6,495,452 B1 | 12/2002 | Shih |
| 6,226,563 B1 | 5/2001 | Lim | | 6,503,839 B1 | 1/2003 | Gonzales et al. |
| 6,226,792 B1 | 5/2001 | Goiffon et al. | | 6,515,368 B1 | 2/2003 | Lopatin et al. |
| 6,228,280 B1 | 5/2001 | Li et al. | | 6,517,413 B1 | 2/2003 | Hu et al. |
| 6,230,069 B1 | 5/2001 | Campbell et al. | | 6,517,414 B1 | 2/2003 | Tobin et al. |
| 6,236,903 B1 | 5/2001 | Kim et al. | | 6,528,409 B1 | 3/2003 | Lopatin et al. |
| 6,237,050 B1 | 5/2001 | Kim et al. | | 6,529,789 B1 | 3/2003 | Campbell et al. |
| 6,238,937 B1 | 5/2001 | Toprac et al. | | 6,532,555 B1 | 3/2003 | Miller et al. |
| 6,240,328 B1 | 5/2001 | LaLonde et al. | | 6,535,783 B1 | 3/2003 | Miller et al. |
| 6,240,330 B1 | 5/2001 | Kurtzberg et al. | | 6,537,912 B1 | 3/2003 | Agarwal |
| 6,240,331 B1 | 5/2001 | Yun | | 6,540,591 B1 * | 4/2003 | Pasadyn et al. ............... 451/41 |
| 6,246,972 B1 | 6/2001 | Klimasauskas | | 6,541,401 B1 | 4/2003 | Herner et al. |
| 6,248,602 B1 | 6/2001 | Bode et al. | | 6,546,508 B1 | 4/2003 | Sonderman et al. |
| 6,249,712 B1 | 6/2001 | Boiquaye | | 6,556,881 B1 | 4/2003 | Miller |
| 6,252,412 B1 | 6/2001 | Talbot et al. | | 6,563,308 B1 | 5/2003 | Nagano et al. |
| 6,253,366 B1 | 6/2001 | Mutschler, III | | 6,580,958 B1 | 6/2003 | Takano |
| 6,259,160 B1 | 7/2001 | Lopatin et al. | | 6,587,744 B1 * | 7/2003 | Stoddard et al. ............ 700/121 |
| 6,263,255 B1 | 7/2001 | Tan et al. | | 6,588,007 B1 | 7/2003 | Pasadyn et al. |
| 6,268,270 B1 | 7/2001 | Scheid et al. | | 6,605,549 B1 | 8/2003 | Leu et al. |
| 6,271,670 B1 | 8/2001 | Caffey | | 6,607,976 B1 | 8/2003 | Chen et al. |
| 6,276,989 B1 | 8/2001 | Campbell et al. | | 6,609,946 B1 | 8/2003 | Tran |
| 6,277,014 B1 | 8/2001 | Chen et al. | | 6,616,513 B1 | 9/2003 | Osterheld |
| 6,278,899 B1 | 8/2001 | Piche et al. | | 6,624,075 B1 | 9/2003 | Lopatin et al. |
| 6,280,289 B1 | 8/2001 | Wiswesser et al. | | 6,630,741 B1 | 10/2003 | Lopatin et al. |
| 6,281,127 B1 | 8/2001 | Shue | | 6,652,355 B1 | 11/2003 | Wiswesser et al. |
| 6,284,622 B1 | 9/2001 | Campbell et al. | | 6,660,633 B1 | 12/2003 | Lopatin et al. |
| 6,287,879 B1 | 9/2001 | Gonzales et al. | | 6,678,570 B1 | 1/2004 | Pasadyn et al. |
| 6,290,572 B1 | 9/2001 | Hofmann | | 6,708,074 B1 | 3/2004 | Chi et al. |
| 6,291,367 B1 | 9/2001 | Kelkar | | 6,708,075 B1 | 3/2004 | Sonderman et al. |
| 6,292,708 B1 | 9/2001 | Allen et al. | | 6,725,402 B1 | 4/2004 | Coss, Jr. et al. |
| 6,298,274 B1 | 10/2001 | Inoue | | 6,728,587 B1 * | 4/2004 | Goldman et al. ............ 700/108 |

| | | | |
|---|---|---|---|
| 6,735,492 B1 | 5/2004 | Conrad et al. | |
| 6,751,518 B1 | 6/2004 | Sonderman et al. | |
| 6,774,998 B1 | 8/2004 | Wright et al. | |
| 6,842,659 B1 | 1/2005 | Parikh et al. | |
| 2001/0001755 A1 | 5/2001 | Sandhu et al. | |
| 2001/0003084 A1 | 6/2001 | Finarov | |
| 2001/0006873 A1 | 7/2001 | Moore | |
| 2001/0030366 A1 | 10/2001 | Nakano et al. | |
| 2001/0039462 A1 | 11/2001 | Mendez et al. | |
| 2001/0040997 A1 | 11/2001 | Tsap et al. | |
| 2001/0042690 A1 | 11/2001 | Talieh | |
| 2002/0032499 A1 | 3/2002 | Wilson et al. | |
| 2002/0058460 A1 | 5/2002 | Lee et al. | |
| 2002/0070126 A1 | 6/2002 | Sato et al. | |
| 2002/0077031 A1 | 6/2002 | Johansson et al. | |
| 2002/0081951 A1 | 6/2002 | Boyd et al. | |
| 2002/0089676 A1 | 7/2002 | Pecen et al. | |
| 2002/0102853 A1 | 8/2002 | Li et al. | |
| 2002/0107599 A1 | 8/2002 | Patel et al. | |
| 2002/0113039 A1 | 8/2002 | Mok et al. | |
| 2002/0127950 A1 | 9/2002 | Hirose et al. | |
| 2002/0128805 A1 | 9/2002 | Goldman et al. | |
| 2002/0149359 A1 | 10/2002 | Crouzen et al. | |
| 2002/0165636 A1 | 11/2002 | Hasan | |
| 2002/0183986 A1 | 12/2002 | Stewart et al. | |
| 2002/0185658 A1 | 12/2002 | Inoue et al. | |
| 2002/0193899 A1 | 12/2002 | Shanmugasundram et al. | |
| 2002/0193902 A1 | 12/2002 | Shanmugasundram et al. | |
| 2002/0197745 A1 | 12/2002 | Shanmugasundram et al. | |
| 2002/0197934 A1 | 12/2002 | Paik | |
| 2002/0199082 A1 | 12/2002 | Shanmugasundram et al. | |
| 2003/0017256 A1 | 1/2003 | Shimane | |
| 2003/0020909 A1 | 1/2003 | Adams et al. | |
| 2003/0020928 A1 | 1/2003 | Ritzdorf et al. | |
| 2003/0154062 A1 | 8/2003 | Daft et al. | |

FOREIGN PATENT DOCUMENTS

| | | | |
|---|---|---|---|
| CA | 2165847 | | 8/1991 |
| CA | 2194855 | | 8/1991 |
| EP | 0 397 924 | A1 | 11/1990 |
| EP | 0 621 522 | A2 | 10/1994 |
| EP | 0 747 795 | A2 | 12/1996 |
| EP | 0 869 652 | | 10/1998 |
| EP | 0 877 308 | A2 | 11/1998 |
| EP | 0 881 040 | A2 | 12/1998 |
| EP | 0 895 145 | A1 | 2/1999 |
| EP | 0 910 123 | | 4/1999 |
| EP | 0 932 194 | | 7/1999 |
| EP | 0 932 195 | A1 | 7/1999 |
| EP | 1 066 925 | A2 | 1/2001 |
| EP | 1 067 757 | | 1/2001 |
| EP | 1 071 128 | | 1/2001 |
| EP | 1 083 470 | A2 | 3/2001 |
| EP | 1 092 505 | A2 | 4/2001 |
| EP | 1072967 | A3 | 11/2001 |
| EP | 1 182 526 | A2 | 2/2002 |
| GB | 2 347 885 | A | 9/2000 |
| GB | 2 365 215 | A | 2/2002 |
| JP | 61-66104 | | 4/1986 |
| JP | 61-171147 | | 8/1986 |
| JP | 01-283934 | | 11/1989 |
| JP | 3-202710 | | 9/1991 |
| JP | 05-151231 | | 6/1993 |
| JP | 05-216896 | | 8/1993 |
| JP | 05-266029 | | 10/1993 |
| JP | 06-110894 | | 4/1994 |
| JP | 06-176994 | | 6/1994 |
| JP | 06-184434 | | 7/1994 |
| JP | 06-252236 | | 9/1994 |
| JP | 06-260380 | | 9/1994 |
| JP | 8-23166 | | 1/1996 |
| JP | 08-50161 | | 2/1996 |
| JP | 08-149583 | | 6/1996 |
| JP | 08-304023 | | 11/1996 |
| JP | 09-34535 | | 2/1997 |
| JP | 9-246547 | | 9/1997 |
| JP | 10-34522 | | 2/1998 |
| JP | 10-173029 | | 6/1998 |
| JP | 11-67853 | | 3/1999 |
| JP | 11-126816 | | 5/1999 |
| JP | 11-135601 | | 5/1999 |
| JP | 2000-183001 | | 6/2000 |
| JP | 2001-76982 | | 3/2001 |
| JP | 2001-284299 | | 10/2001 |
| JP | 2001-305108 | | 10/2001 |
| JP | 2002-9030 | | 1/2002 |
| JP | 2002-343754 | | 11/2002 |
| TW | 434103 | | 5/2001 |
| TW | 436383 | | 5/2001 |
| TW | 455938 | | 9/2001 |
| TW | 455976 | | 9/2001 |
| WO | WO 95/34866 | | 12/1995 |
| WO | WO 98/05066 | | 2/1998 |
| WO | WO 98/45090 | | 10/1998 |
| WO | WO 99/09371 | | 2/1999 |
| WO | WO 99/25520 | | 5/1999 |
| WO | WO 00/00874 | | 1/2000 |
| WO | WO 00/05759 | | 2/2000 |
| WO | WO 00/35063 | | 6/2000 |
| WO | WO 00/54325 | | 9/2000 |
| WO | WO 00/79355 | A1 | 12/2000 |
| WO | WO 01/11679 | | 2/2001 |
| WO | WO 01/15865 | A1 | 3/2001 |
| WO | WO 01/18623 | | 3/2001 |
| WO | WO 01/25865 | | 4/2001 |
| WO | WO 01/33277 | | 5/2001 |
| WO | WO 01/33501 | A1 | 5/2001 |
| WO | WO 01/50206 | A1 | 7/2001 |
| WO | WO 01/52055 | A3 | 7/2001 |
| WO | WO 01/57823 | A2 | 8/2001 |
| WO | WO 01/080306 | | 10/2001 |
| WO | WO 02/17150 | A1 | 2/2002 |
| WO | WO 02/31613 | A2 | 4/2002 |
| WO | WO 02/31613 | A3 | 4/2002 |
| WO | WO 02/33737 | A2 | 4/2002 |
| WO | WO 02/074491 | | 9/2002 |

OTHER PUBLICATIONS

Hu, Albert, He Du, Steve Wong, Peter Renteln, and Emanuel Sachs. 1994. "Application of Run by Run Controller to the Chemical-Mechanical Planarization Process." IEEE/CPMT International Electronics Manufacturing Technology Symposium. pp. 371-378.

Smith, Taber, Duane Boning, James Moyne, Arnon Hurwitz, and John Curry. Jun. 1996. "Compensating for CMP Pad Wear Using Run by Run Feedback Control." Proceedings of the Thirteenth International VLSI Multilevel Interconnection Conference. pp. 437-439.

Suzuki, Junichi and Yoshikazu Yamamoto. 1998. "Toward the Interoperable Software Design Models: Quartet of UML, XML, DOM and CORBA." Proceedings IEEE International Software Engineering Standards Symposium. pp. 1-10.

Klein, Bruce. Jun. 1999. "Application Development: XML Makes Object Models More Useful." Informationweek. pp. 1A-6A.

Chemali, Chadi El, James Moyne, Kareemullah Khan, Rock Nadeau, Paul Smith, John Colt, Jonathan Chapple-Sokol, and Tarun Parikh. Jul./Aug. 2000. "Multizone Uniformity Control of a Chemical Mechanical Polishing Process Utilizing a Pre- and Postmeasurement Strategy." J. Vac. Sci. Technol. A, vol. 18(4). pp. 1287-1296. American Vacuum Society.

Jensen, Alan, Peter Renteln, Stephen Jew, Chris Raeder, and Patrick Cheung. Jun. 2001. "Empirical-Based Modeling for Control of CMP Removal Uniformity." *Solid State Technology*, vol. 44, No. 6, pp. 101-102, 104, 106. Cowan Publ. Corp.: Washington, D.C.

Sarfaty, Moshe, Arulkumar Shanmugasundram, Alexander Schwarm, Joseph Paik, Jimin Zhang, Rong Pan, Martin J. Seamons, Howard Li, Raymond Hung, and Suketu Parikh. Apr./May 2002. "Advance Process Control Solutions for Semiconductor Manufacturing." IEEE/SEMI Advanced Semiconductor Manufacturing Conference. pp. 101-106.

Oct. 4, 2002. International Search Report from PCT/US01/22833.

Oct. 23, 2002. International Search Report from PCT/US01/27406.

Nov. 7, 2002. International Search Report from PCT/US02/19061.

Nov. 11, 2002. International Search Report from PCT/US02/19117.

Nov. 12, 2002. International Search Report from PCT/US02/19063.

Ostanin, Yu.Ya. Oct. 1981. "Optimization of Thickness Inspection of Electrically Conductive Single-Layer Coatings with Laid-on Eddy-Current Transducers (Abstract)." *Defektoskopiya*, vol. 17, No. 10, pp. 45-52. Moscow, USSR.

Feb. 1984. "Substrate Screening Process." *IBM Technical Disclosure Bulletin*, pp. 4824-4825.

Herrmann, D. 1988. "Temperature Errors and Ways of Elimination for Contactless Measurement of Shaft Vibrations (Abstract)." *Technisches Messen™*, vol. 55, No. 1, pp. 27-30. West Germany.

Lin, Kuang-Kuo and Costas J. Spanos. Nov. 1990. "Statistical Equipment Modeling for VLSI Manufacturing: An Application for LPCVD." *IEEE Transactions on Semiconductor Manufacturing*, v. 3, n. 4, pp. 216-229.

Chang, Norman H. and Costas J. Spanos. Feb. 1991. "Continuous Equipment Diagnosis Using Evidence Integration: An LPCVD Application." *IEEE Transactions on Semiconductor Manufacturing*, v. 4, n. 1, pp. 43-51.

Larrabee, G. B. May 1991. "The Intelligent Microelectronics Factory of the Future (Abstract)." *IEEE/SEMI International Semiconductor Manufacturing Science Symposium*, pp. 30-34. Burlingame, CA.

Burke, Peter A. Jun. 1991. "Semi-Empirical Modelling of SiO2 Chemical-Mechanical Polishing Planarization." *VMIC Conference, 1991 IEEE*, pp. 379-384. IEEE.

May 1992. "Laser Ablation Endpoint Detector." *IBM Technical Disclosure Bulletin*, pp. 333-334.

Spanos, Costas J., Hai-Fang Guo, Alan Miller, and Joanne Levine-Parrill. Nov. 1992. "Real-Time Statistical Process Control Using Tool Data." *IEEE Transactions on Semiconductor Manufacturing*, v. 5, n. 4, pp. 308-318.

Feb. 1993. "Electroless Plating Scheme to Hermetically Seal Copper Features." *IBM Technical Disclosure Bulletin*, pp. 405-406.

Scarr, J. M. and J. K. Zelisse. Apr. 1993. "New Topology for Thickness Monitoring Eddy Current Sensors (Abstract)." *Proceedings of the 36th Annual Technical Conference*, Dallas, Texas.

Matsuyama, Akira and Jessi Niou. 1993. "A State-of-the-Art Automation System of an ASIC Wafer Fab in Japan." *IEEE/SEMI International Semiconductor Manufacturing Science Syposium*, pp. 42-47.

Yeh, C. Eugene, John C. Cheng, and Kwan Wong. 1993. "Implementation Challenges of a Feedback Control System for Wafer Fabrication." *IEEE/CHMT International Electronics Manufacturing Technology Symposium*, pp. 438-442.

Kurtzberg, Jerome M. and Menachem Levanoni. Jan. 1994. "ABC: A Better Control for Manufacturing." *IBM Journal of Research and Development*, v. 38, n. 1, pp. 11-30.

Mozumder, Purnendu K. and Gabriel G. Barna. Feb. 1994. "Statistical Feedback Control of a Plasma Etch Process." *IEEE Transactions on Semiconductor Manufacturing*, v. 7, n. 1, pp. 1-11.

Muller-Heinzerling, Thomas, Ulrich Neu, Hans Georg Nurnberg, and Wolfgang May. Mar. 1994. "Recipe-Controlled Operation of Batch Processes with Batch X." *ATP Automatisierungstechnische Praxis*, vol. 36, No. 3, pp. 43-51.

Stoddard, K., P. Crouch, M. Kozicki, and K. Tsakalis. Jun.-Jul. 1994. "Application of Feedforward and Adaptive Feedback Control to Semiconductor Device Manufacturing (Abstract)." *Proceedings of 1994 American Control Conference—ACC '94*, vol. 1, pp. 892-896. Baltimore, Maryland.

Schaper, C. D., M. M. Moslehi, K. C. Saraswat, and T. Kailath. Nov. 1994. "Modeling, Identification, and Control of Rapid Thermal Processing Systems (Abstract)." *Journal of the Electrochemical Society*, vol. 141, No. 11, pp. 3200-3209.

Tao, K. M., R. L. Kosut, M. Ekblad, and G. Aral. Dec. 1994. "Feedforward Learning Applied to RTP of Semiconductor Wafers (Abstract)." *Proceedings of the 33rd IEEE Conference on Decision and Control*, vol. 1, pp. 67-72. Lake Buena Vista, Florida.

Hu, Albert, He Du, Steve Wong, Peter Renteln, and Emmanuel Sachs. 1994. "Application of Run by Run Controller to the Chemical-Mechanical Planarization Process." *IEEE/CPMT International Electronics Manufacturing Technology Symposium*, pp. 371-378.

Spanos, C. J., S. Leang, S.-Y. Ma, J. Thomson, B. Bombay, and X. Niu. May 1995. "A Multistep Supervisory Controller for Photolithographic Operations (Abstract)." *Proceedings of the Symposium on Process Control, Diagnostics, and Modeling in Semiconductor Manufacturing*, pp. 3-17.

Leang, Sovarong, Shang-Yi Ma, John Thomson, Bart John Bombay, and Costas J. Spanos. May 1996. "A Control System for Photolithographic Sequences." *IEEE Transactions on Semiconductor Manufacturing*, vol. 9, No. 2.

Boning, Duane S., William P. Moyne, Taber H. Smith, James Moyne, Ronald Telfeyan, Arnon Hurwitz, Scott Shellman, and John Taylor. Oct. 1996. "Run by Run Control of Chemical-Mechanical Polishing." *IEEE Transactions on Components, Packaging, and Manufacturing Technology—Part C*, vol. 19, No. 4, pp. 307-314.

Zhe, Ning, J. R. Moyne, T. Smith, D. Boning, E. Del Castillo, Yeh Jinn-Yi, and Hurwitz. Nov. 1996. "A Comparative Analysis of Run-to-Run Control Algorithms in Semiconductor Manufacturing Industry (Abstract)." *IEEE/SEMI 1996 Advanced Semiconductor Manufacturing Conference Workshop*, pp. 375-381.

Yasuda, M., T. Osaka, and M. Ikeda. Dec. 1996. "Feedforward Control of a Vibration Isolation System for Disturbance Suppression (Abstract)." *Proceeding of the 35th IEEE Conference on Decision and Control*, vol. 2, pp. 1229-1233. Kobe, Japan.

Fan, Jr-Min, Ruey-Shan Guo, Shi-Chung Chang, and Kian-Huei Lee. 1996. "Abnormal Tred Detection of Sequence-Disordered Data Using EWMA Method." *IEEE/SEMI*

*Advanced Semiconductor Manufacturing Conference*, pp. 169-174.

Smith, Taber and Duane Boning. 1996. "A Self-Tuning EWMA Controller Utilizing Artificial Neural Network Function Approximation Techniques." *IEEE/CPMT International Electronics Manufacturing Technology Symposium*, pp. 355-363.

Guo, Ruey-Shan, Li-Shia Huang, Argon Chen, and Jin-Jung Chen. Oct. 1997. "A Cost-Effective Methodology for a Run-by-Run EWMA Controller." *6th International Symposium on Semiconductor Manufacturing*, pp. 61-64.

Mullins, J. A., W. J. Campbell, and A. D. Stock. Oct. 1997. "An Evaluation of Model Predictive Control in Run-to-Run Processing in Semiconductor Manufacturing (Abstract)." *Proceedings of the SPIE—The International Society for Optical Engineering Conference*, vol. 3213, pp. 182-189.

Reitman, E. A., D. J. Friedman, and E. R. Lory. Nov. 1997. "Pre-Production Results Demonstrating Multiple-System Models for Yield Analysis (Abstract)." *IEEE Transactions on Semiconductor Manufacturing*, vol. 10, No. 4, pp. 469-481.

Durham, Jim and Myriam Roussel. 1997. "A Statistical Method for Correlating In-Line Defectivity to Probe Yield." *IEEE/SEMI Advanced Semiconductor Manufacturing Conference*, pp. 76-77.

Shindo, Wataru, Eric H. Wang, Ram Akella, and Andrzej J. Strojwas. 1997. "Excursion Detection and Source Isolation in Defect Inspection and Classification." *2nd International Workshop on Statistical Metrology*, pp. 90-93.

Jul. 1998. "Active Controller: Utilizing Active Databases for Implementing Multistep Control of Semiconductor Manufacturing (Abstract)." *IEEE Transactions on Components, Packaging and Manufacturing Technology—Part C*, vol. 21, No. 3, pp. 217-224.

Fang, S. J., A. Barda, T. Janecko, W. Little, D. Outley, G. Hempel, S. Joshi, B. Morrison, G. B. Shinn, and M. Birang. 1998. "Control of Dielectric Chemical Mechanical Polishing (CMP) Using and Interferometry Based Endpoint Sensor." *International Proceedings of the IEEE Interconnect Technology Conference*, pp. 76-78.

Ouma, Dennis, Duane Boning, James Chung, Greg Shinn, Leif Olsen, and John Clark. 1998. "An Integrated Characterization and Modeling Methodology for CMP Dielectric Planarization." *Proceedings of the IEEE 1998 International Interconnect Technology Conference*, pp. 67-69.

Boning, Duane S., Jerry Stefani, and Stephanie W. Butler. Feb. 1999. "Statistical Methods for Semiconductor Manufacturing." *Encyclopedia of Electrical Engineering, J. G. Webster, Ed.*

McIntosh, John. Mar. 1999. "Using CD-SEM Metrology in the Manufacture of Semiconductors (Abstract)." *JOM*, vol. 51, No. 3, pp. 38-39.

Pan, J. Tony, Ping Li, Kapila Wijekoon, Stan Tsai, and Fritz Redeker. May 1999. "Copper CMP Integration and Time Dependent Pattern Effect." *IEEE 1999 International Interconnect Technology Conference*, pp. 164-166.

Meckl, P. H. and K. Umemoto. Aug. 1999. "Achieving Fast Motions in Semiconductor Manufacturing Machinery (Abstract)." *Proceedings of the 1999 IEEE International Conference on Control Applications*, vol. 1, pp. 725-729. Kohala Coast, HI.

Khan, K., C. El Chemali, J. Moyne, J. Chapple-Sokol, R. Nadeau, P. Smith, C., and T. Parikh. Oct. 1999. "Yield Improvement at the Contact Process Through Run-to-Run Control (Abstract)." *24th IEEE/CPMT Electronics Manufacturing Technology Symposium*, pp. 258-263.

Ruegsegger, Steven, Aaron Wagner, James S. Freudenberg, and Dennis S. Grimard. Nov. 1999. "Feedforward Control for Reduced Run-to-Run Variation in Microelectronics Manufacturing." *IEEE Transactions on Semiconductor Manufacturing*, vol. 12, No. 4.

Nov. 1999. "How to Use EWMA to Achieve SPC and EPC Control." *International Symposium on NDT Contribution to the Infrastructure Safety Systems*, Tores, Brazil. <http://www.ndt.net/abstract/ndtiss99/data/35.htm>.

Edgar, T. F., W. J. Campbell, and C. Bode. Dec. 1999. "Model-Based Control in Microelectronics Manufacturing." *Proceedings of the 38th IEEE Conference on Decision and Control*, Phoenix, Arizona, vol. 4, pp. 4185-4191.

Meckl, P. H. and K. Umemoto. Apr. 2000. "Achieving Fast Motions by Using Shaped Reference Inputs [Semiconductor Manufacturing Machine] (Abstract)." *NEC Research and Development*, vol. 41, No. 2, pp. 232-237.

Oechsner, R., T. Tschaftary, S. Sommer, L. Pfitzner, H. Ryssel, H. Gerath, C. Baier, and M. Hafner. Sep. 2000. "Feed-forward Control for a Lithography/Etch Sequence (Abstract)." *Proceedings of the SPIE—The International Society for Optical Engineering Conference*, vol. 4182, pp. 31-39.

Cheung, Robin. Oct. 18, 2000. "Copper Interconnect Technology." *AVS/CMP User Group Meeting*, Santa Clara, CA.

Edgar, Thomas F., Stephanie W. Butler, W. Jarrett Campbell, Carlos Pfeiffer, Christopher Bode, Sung Bo Hwang, K. S. Balakrishnan, and J. Hahn. Nov. 2000. "Automatic Control in Microelectronics Manufacturing: Practices, Challenges, and Possibilities (Abstract)." *Automatica*, v. 36, n. 11.

Khan, S., M. Musavi, and H. Ressom. Nov. 2000. "Critical Dimension Control in Semiconductor Manufacturing (Abstract)." *ANNIE 2000. Smart Engineering Systems Design Conference*, pp. 995-1000. St. Louis, Missouri.

ACM Research Inc. 2000. "Advanced Copper Metallization for 0.13 to 0.05 μm & Beyond." <http://acmrc.com/press/ACM-ECP-brochure.pdf>.

Ravid, Avi, Avner Sharon, Amit Weingarten, Vladimir Machavariani, and David Scheiner. 2000. "Copper CMP Planarity Control Using ITM." *IEEE/SEMI Advanced Semiconductor Manufacturing Conference*, pp. 437-443.

Chen, Argon and Ruey-Shan Guo. Feb. 2001. "Age-Based Double EWMA Controller and Its Application to CMP Processes." *IEEE Transactions on Semiconductor Manufacturing*, vol. 14, No. 1, pp. 11-19.

Tobin, K. W., T. P. Karnowski, L. F. Arrowood, and F. Lakhani. Apr. 2001. "Field Test Results of an Automated Image Retrieval System (Abstract)." *Advanced Semiconductor Manufacturing Conference, 2001 IEEE/SEMI*, Munich, Germany.

Tan, K. K., H. F. Dou, and K. Z. Tang. May-Jun. 2001. "Precision Motion Control System for Ultra-Precision Semiconductor and Electronic Components Manufacturing (Abstract)." *51st Electronic Components and Technology Conference 2001. Proceedings*, pp. 1372-1379. Orlando, Florida.

Heuberger, U. Sep. 2001. "Coating Thickness Measurement with Dual-Function Eddy-Current & Magnetic Inductance Instrument (Abstract)." *Galvanotechnik*, vol. 92, No. 9, pp. 2354-2366+IV.

Wang, LiRen and Hefin Rowlands. 2001. "A Novel NN-Fuzzy-SPC Feedback Control System." *8th IEEE International Conference on Emerging Technologies and Factory Automation*, pp. 417-423.

Moyne, J., V. Solakhian, A. Yershov, M. Anderson, and D. Mockler-Hebert. Apr.-May 2002. "Development and Deployment of a Multi-Component Advanced Process Control System for an Epitaxy Tool (Abstract)." *2002 IEEE Advanced Semiconductor Manufacturing Conference and Workshop*, pp. 125-130.

Sarfaty, M., A. Shanmugasundram, A. Schwarm, J. Paik, Jimin Zhang, Rong Pan, M. J. Seamons, H. Li, R. Hung, and S. Parikh. Apr.-May 2002. "Advance Process Control Solutions for Semiconductor Manufacturing (Abstract)." *13th Annual IEEE/SEMI Advanced Semiconductor Manufacturing Conference. Advancing the Science and Technology of Semiconductor Manufacturing. ASMC 2002*, pp. 101-106. Boston, MA.

Campbell, W. J., S. K. Firth, A. J. Toprac, and T. F. Edgar. May 2002. "A Comparison of Run-to-Run Control Algorithms (Abstract)." *Proceedings of 2002 American Control Conference*, vol. 3, pp. 2150-2155.

Good, Richard and S. Joe Qin. May 2002. "Stability Analysis of Double EWMA Run-to-Run Control with Metrology Delay." *IEEE/CPMT International Electronics Manufacturing Technology Symposium*, pp. 355-363.

Smith, Stewart, Anthony J. Walton, Alan W. S. Ross, Georg K. H. Bodammer, and J. T. M. Stevenson. May 2002. "Evaluation of Sheet Resistance and Electrical Linewidth Measurement Techniques for Copper Damascene Interconnect." *IEEE Transactions on Semiconductor Manufacturing*, vol. 15, No. 2, pp. 214-222.

Itabashi, Takeyuki, Hiroshi Nakano, and Haruo Akahoshi. Jun. 2002. "Electroless Deposited CoWB for Copper Diffusion Barrier Metal." *IEEE International Interconnect Technology Conference*, pp. 285-287.

ACM Research, Inc. 2002. "ACM Ultra ECP® System: Electro-Copper Plating (ECP) Deposition." www.acmrc.com/ecp.html.

Applied Materials, Inc. 2002. "Applied Materials: Information for Everyone: Copper Electrochemical Plating." www.appliedmaterials.com/products/copper_electrochemical_plating.html.

KLA-Tencor Corporation. 2002. "KLA Tencor: Press Release: KLA-Tencor Introduces First Production-Worthy Copper CMP In-Situ Film Thickness and End-point Control System: Multi-Million Dollar Order Shipped to Major CMP Tool Manufacturer." www.kla-tencor.com/news_events/press_releases/press_releases2001/984086002.html.

Takahashi, Shingo, Kaori Tai, Hiizu Ohtorii, Naoki Komai, Yuji Segawa, Hiroshi Horikoshi, Zenya Yasuda, Hiroshi Yamada, Masao Ishihara, and Takeshi Nogami. 2002. "Fragile Porous Low-k/Copper Integration by Using Electro-Chemical Polishing." *2002 Symposium on VLSI Technology Digest of Technical Papers*, pp. 32-33.

Cunningham, James A. 2003. "Using Electrochemistry to Improve Copper Interconnects." <http://www.e-insite.net/semiconductor/index.asp?layout=article&articleid=CA47465>.

Mar. 25, 2003. International Search Report for PCT/US02/24859 prepared by the European Patent Office.

Adams, Bret W., Bogdan Swedek, Rajeev Bajaj, Fritz Redeker, Manush Birang, and Gregory Amico. "Full-Wafer Endpoint Detection Improves Process Control in Copper CMP." *Semiconductor Fabtech*—12th Edition. Applied Materials, Inc., Santa Clara, CA.

Berman, Mike, Thomas Bibby, and Alan Smith. "Review of In Situ & In-line Detection for CMP Applications." *Semiconductor Fabtech*, 8th Edition, pp. 267-274.

"Semiconductor Manufacturing: An Overview." <http://users.ece.gatech.edu/~gmay/overview.html>.

Jul. 23, 2002. Communication Pursuant to Article 96(2) EPC for European Patent Application No. 00 115 577.9.

Oct. 15, 2002. International Search Report prepared by the European Patent Office for PCT/US02/19062.

Dishon, G., D. Eylon, M. Finarov, and A. Shulman. "Dielectric CMP Advanced Process Control Based on Integrated Monitoring." Ltd. Rehoveth, Israel: Nova Measuring Instruments.

Feb. 1984. "Method and Apparatus of in Situ Measurement and Overlay Error Analysis for Correcting Step and Repeat Lithographic Cameras." *IBM Technical Disclosure Bulletin*, pp. 4855-4859.

Oct. 1984. "Method to Characterize the Stability of a Step and Repeat Lithographic System." *IBM Technical Disclosure Bulletin*, pp. 2857-2860.

Runyan, W. R., and K. E. Bean. 1990. "Semiconductor Integrated Circuit Processing Technology." p. 48. Reading, Massachusetts: Addison-Wesley Publishing Company.

Zorich, Robert. 1991. *Handbook of Quality Integrated Circuit Manufacturing*. pp. 464-498 San Diego, California: Academic Press, Inc.

Rampalli, Prasad, Arakere Ramesh, and Nimish Shah. 1991. *CEPT—A Computer-Aided Manufacturing Application for Managing Equipment Reliability and Availability in the Semiconductor Industry*. New York, New York: IEEE.

Moyne, James R., Nauman Chaudhry, and Roland Telfeyan. 1995. "Adaptive Extensions to a Multi-Branch Run-to-Run Controller for Plasma Etching." *Journal of Vacuum Science and Technology*. Ann Arbor, Michigan: University of Michigan Display Technology Manufacturing Center.

Moyne, James, Roland Telfeyan, Arnon Hurwitz, and John Taylor. Aug. 1995. "A Process-Independent Run-to-Run Controller and Its Application to Chemical-Mechanical Planarization." *SEMI/IEEE Advanced Semiconductor Manufacturing Conference and Workshop*. Ann Arbor, Michigan: The University of Michigan, Electrical Engineering & Computer Science Center for Display Technology & Manufacturing.

Zhou, Zhen-Hong and Rafael Reif. Aug. 1995. "Epi-Film Thickness Measurements Using Emission Fourier Transform Infrared Spectroscopy—Part II: Real-Time *in Situ* Process Monitoring and Control." IEEE Transactions on Semiconductor Manufacturing, vol. 8, No. 3.

Telfeyan, Roland, James Moyne, Nauman Chaudhry, James Pugmire, Scott Shellman, Duane Boning, William Moyne, Arnon Hurwitz, and John Taylor. Oct. 1995. "A Multi-Level Approach to the Control of a Chemical-Mechanical Planarization Process." Minneapolis, Minnesota: 42nd National Symposium of the American Vacuum Society.

Chang, E., B. Stine, T. Maung, R. Divecha, D. Boning, J. Chung, K. Chang, G. Ray, D. Bradbury, O. S. Nakagawa, S. Oh, and D. Bartelink. Dec. 1995. "Using a Statistical Metrology Framework to Identify Systematic and Random Sources of Die- and Wafer-level ILD Thickness Variation in CMP Processes." Washington, D.C.: International Electron Devices Meeting.

Schmids, Hans Albrecht. 1995. "Creating the Architecture of a Manufacturing Framework by Design Patterns." Austin, Texas: OOPSLA.

Dishon, G., M. Finarov, R. Kipper, J.W. Curry, T. Schraub, D. Trojan, 4th Stambaugh, Y. Li and J. Ben-Jacob. Feb. 1996. "On-Line Integrated Metrology for CMP Processing." Santa Clara, California: VMIC Speciality Conferences, 1st International CMP Planarization Conference.

Smith, Taber, Duane Boning, James Moyne, Arnon Hurwitz, and John Curry. Jun. 1996. "Compensating for CMP Pad Wear Using Run by Run Feedback Control." Santa Clara, California: VLSI Multilevel Interconnect Conference.

Boning, Duane, William Moyne, Taber Smith, James Moyne, Roland Telfeyan, Arnon Hurwitz, Scott Shellman, and John Taylor. Oct. 1996. "Run by Run Control of Chemical-Mechanical Polishing." *IEEE Trans. CPMT (C)*, vol. 19, No. 4, pp. 307-314.

SEMI. [1986] 1996. "Standard for Definition and Measurement of Equipment Reliability, Availability, and Maintainability (RAM)." SEMI E10-96.

U.S. Appl. No. 09/363,966, filed Jul. 29, 1999, Arackaparambil et al., Computer Integrated Manufacturing Techniques.

U.S. Appl. No. 09/469,227, filed Dec. 22, 1999, Somekh et al., Multi-Tool Control System, Method and Medium.

U.S. Appl. No. 09/619,044, filed Jul. 19, 2000, Yuan, System and Method of Exporting or Importing Object Data in a Manufacturing Execution System.

U.S. Appl. No. 09/637,620, filed Aug. 11, 2000, Chi et al., Generic Interface Builder.

U.S. Appl. No. 09/656,031, filed Sep. 6, 2000, Chi et al., Dispatching Component for Associating Manufacturing Facility Service Requestors with Service Providers.

U.S. Appl. No. 09/655,542, filed Sep. 6, 2000, Yuan, System, Method and Medium for Defining Palettes to Transform an Application Program Interface for a Service.

Van Zant, Peter. 1997. *Microchip Fabrication: A Practical Guide to Semiconductor Processing*. Third Edition, pp. 472-478. New York, New York: McGraw-Hill.

Campbell, W. Jarrett, and Anthony J. Toprac. Feb. 11-12, 1998. "Run-to-Run Control in Microelectronics Manufacturing." Advanced Micro Devises, TWMCC.

Edgar, Thomas F., Stephanie W. Butler, Jarrett Campbell, Carlos Pfeiffer, Chris Bode, Sung Bo Hwang, and K.S. Balakrishnan. May 1998. "Automatic Control in Microelectronics Manufacturing: Practices, Challenges, and Possibilities." Automatica, vol. 36, pp. 1567-1603, 2000.

Moyne, James, and John Curry. Jun. 1998. "A Fully Automated Chemical-Mechanical Planarization Process." Santa Clara, California: VLSI Multilevel Interconnection (V-MIC) Conference.

SEMI. Jul. 1998. *New Standard: Provisional Specification for CIM Framework Domain Architecture*. Mountain View, California: SEMI Standards. SEMI Draft Doc. 2817.

Consilium. Aug. 1998. *Quality Management Component: QMC™ and QMC-Link™ Overview*. Mountain View, California: Consilium, Inc.

U.S. Appl. No. 09/725,908, filed Nov. 30, 2000, Chi et al., Dynamic Subject Information Generation in Message Services of Distributed Object Systems.

U.S. Appl. No. 09/800,980, filed Mar. 8, 2001, Hawkins et al., Dynamic and Extensible Task Guide.

U.S. Appl. No. 09/811,667, filed Mar. 20, 2001, Yuan et al., Fault Tolerant and Automated Computer Software Workflow.

U.S. Appl. No. 09/927,444, filed Aug. 13, 2001, Ward et al., Dynamic Control of Wafer Processing Paths in Semiconductor Manufacturing Processes.

U.S. Appl. No. 09/928,473, filed Aug. 14, 2001, Koh, Tool Services Layer for Providing Tool Service Functions in Conjunction with Tool Functions.

U.S. Appl. No. 09/928,474, filed Aug. 14, 2001, Krishnamurthy et al., Experiment Management System, Method and Medium.

Chemali, Chadi El, James Moyne, Kareemullah Khan, Rock Nadeau, Paul Smith, John Colt, Jonathan Chapple-Sokol, and Tarun Parikh. Nov. 1998. "Multizone Uniformity Control of a CMP Process Utilizing a Pre and Post-Measurement Strategy." Seattle, Washington: SEMETECH Symposium.

Consilium. 1998. *FAB300™*. Mountain View, California: Consilium, Inc.

Khan, Kareemullah, Victor Solakhain, Anthony Ricci, Tier Gu, and James Moyne. 1998. "Run-to-Run Control of ITO Deposition Process." Ann Arbor, Michigan.

Consilium. Jan. 1999. "FAB300™: Consilium's Next Generation MES Solution of Software and Services which Control and Automate Real-Time FAB Operations." www.consilium.com/products/fab300_page.htm#FAB300 *Introduction*.

Baliga, John. Jul. 1999. "Advanced Process Control: Soon to be a Must." Cahners Semiconductor International. www.semiconductor.net/semiconductor/issues/issues/1999/jul99/docs/feature1.asp.

Consilium. Jul. 1999. "Increasing Overall Equipment Effectiveness (OEE) in Fab Manufacturing by Implementing Consilium's Next-Generation Manufacturing Execution System—MES II." Semiconductor Fabtech Edition 10.

Consilium Corporate Brochure. Oct. 1999. www.consilium.com.

U.S. Appl. No. 09/943,383, filed Aug. 31, 2001, Shanmugasundram et al., In Situ Based Control of Semiconductor Processing Procedure.

U.S. Appl. No. 09/943,955, filed Aug. 31, 2001, Shanmugasundram et al., Feedback Control of a Chemical Mechanical Polishing Device Providing Manipulation of Removal Rate Profiles.

U.S. Appl. No. 09/998,372, filed Nov. 30, 2001, Paik, Control of Chemical Mechanical Polishing Pad Conditioner Directional Velocity to Improve Pad Life.

U.S. Appl. No. 09/998,384, filed Nov. 30, 2001, Paik, Feedforward and Feedback Control for Conditioning of Chemical Mechanical Polishing Pad.

U.S. Appl. No. 10/084,092, filed Feb. 28, 2002, Arackaparambil et al., Computer Integrated Manufacturing Techniques.

U.S. Appl. No. 10/100,184, filed Mar. 19, 2002, Al-Bayati et al., Method, System and Medium for Controlling Semiconductor Wafer Processes Using Critical Dimension Measurements.

Moyne, James. Oct. 1999. "Advancements in CMP Process Automation and Control." Hawaii: (Invited paper and presentation to) Third International Symposium on Chemical Mechanical Polishing in IC Device Manufacturing: 196th Meeting of the Electrochemical Society.

Consilium. Nov. 1999. *FAB300™ Update*.

SEMI. 2000. "Provisional Specification for CIM Framework Scheduling Component." San Jose, California. SEMI E105-1000.

Lee, Brian, Duane S. Boning, Winthrop Baylies, Noel Poduje, Pat Hester, Yong Xia, John Valley, Chris Koliopoulus, Dale Hetherington, HongJiang Sun, and Michael Lacy. Apr. 2001. "Wafer Nanotopography Effects on CMP: Experimental Validation of Modeling Methods." San Francisco, California: Materials Research Society Spring Meeting.

Jul. 5, 2001. "Motorola and Advanced Micro Devices Buy ObjectSpace Catalyst Advanced Process Control Product for Five Wafer Fabs." Semiconductor FABTECH. www.semiconductorfabtech.com/industry.news/9907/20.07.shtml.
U.S. Appl. No. 10/135,405, filed May 1, 2002, Reiss et al., Integration of Fault Detection with Run-to-Run Control.
U.S. Appl. No. 10/135,451, filed May 1, 2002, Shanmugasundram et al., Dynamic Metrology Schemes and Sampling Schemes for Advanced Process Control in Semiconductor Processing.
U.S. Appl. No. 10/172,977, filed Jun. 18, 2002, Shanmugasundram et al., Method, System and Medium for Process Contol for the Matching of Tools, Chambers and/or Other Semiconductor-Related Entities.
U.S. Appl. No. 10/174,370, filed Jun. 18, 2002, Shanmugasundram et al., Feedback Control of Plasma-Enhanced Chemical Vapor Deposition Processes.
U.S. Appl. No. 10/174,377, filed Jun. 18, 2002, Schwarm et al., Feedback Control of Sub-Atmospheric Chemical Vapor Deposition Processes.
Oct. 15, 2001. Search Report prepared by the Austrian Patent Office for Singapore Patent Application No. 200004286-1.
NovaScan 2020. Feb. 2002. "Superior Integrated Process Control for Emerging CMP High-End Applications.".
Johnson, Bob. Jun. 10, 2002. "Advanced Process Control Key to Moore's Law." Gartner, Inc.
Jul. 9, 2002. International Search Report prepared by the European Patent Office for PCT/US01/24910.
Jul. 29, 2002. International Search Report prepared by the European Patent Office for PCT/US01/27407.
Sonderman, Thomas. 2002. "APC as a Competitive Manufacturing Technology: *AMD's Vision for 300mm.*" AEC/APC.
Mar. 1992. "Multi-Line Listbox Control For Compound Entries." IBM Technical Disclosure Bulletin, vol. 34, No. 10A, pp. 113-114.
Sep. 1992. "VLSI Metals Management Evaluation System For Additive And Subtractive Metal Technologies." IBM Technical Disclosure Bulletin, vol. 35, No. 4A, pp. 56-61.
IslamRaja, M. M., C. Chang, J. P. McVittie, M. A. Cappelli, and K. C. Saraswat. May/Jun. 1993. "Two Precursor Model for Low-Pressure Chemical Vapor Deposition of Silicon Dioxide from Tetraethylorthosilicate." *J. Vac. Sci. Technol. B*, vol. 11, No. 3, pp. 720-726.
Dec. 1993. "Method For Rapid Performance Analysis and Design of Semiconductor Manufacturing Facilities." IBM Technical Disclosure Bulletin, vol. 36, No. 12, pp. 423-424.
Kim, Eui Jung and William N. Gill. Jul. 1994. "Analytical Model for Chemical Vapor Deposition of $SiO_2$ Films Using Tetraethoxysliane and Ozone" (Abstract). *Journal of Crystal Growth*, vol. 140, Issues 3-4, pp. 315-326.
Sun, S.C. 1998. "CVD and PVD Transition Metal Nitrides as Diffusion Barriers for Cu Metallization." *IEEE*. pp. 243-246.
Guo, R.S, A. Chen, C.L. Tseng, I.K. Fong, A. Yang, C.L. Lee, C.H. Wu, S. Lin, S.J. Huang, Y.C. Lee, S.G. Chang, and M.Y. Lee. Jun. 16-17, 1998. "A Real-Time Equipment Monitoring and Fault Detection System." *Semiconductor Manufacturing Technology Workshop*, pp. 111-121.
Lantz, Mikkel. 1999. "Equipment and APC Integration at AMD with Workstream." *IEEE*, pp. 325-327.
Tagami, M., A. Furuya, T. Onodera, and Y. Hayashi. 1999. "Layered Ta-nitrides (LTN) Barrier Film by Power Swing Sputtering (PSS) Technique for MOCVD-Cu Damascene Interconnects." *IEEE*. pp. 635-638.

Yamagishi, H., Z. Tokei, G.P. Beyer, R. Donaton, H. Bender, T. Nogami, and K. Maex. 2000. "TEM/SEM Investigation and Electrical Evaluation of a Bottomless I-PVD TA(N) Barrier in Dual Damascene" (Abstract). *Advanced Metallization Conference 2000*. San Diego, CA.
Eisenbraun, Eric, Oscar van der Straten, Yu Zhu, Katharine Dovidenko, and Alain Kaloyeros. 2001. "Atomic Layer Deposition (ALD) of Tantalum-Based Materials for Zero Thickness Copper Barrier Applications" (Abstract). *IEEE*. pp. 207-209.
Smith, S.R., K.E. Elers, T. Jacobs, V. Blaschke, and K. Pfeifer. 2001. "Physical and Electrical Characterization of ALD Tin Used as a Copper Diffusion Barrier in 0.25 mum, Dual Damascene Backend Structures" (Abstract). *Advanced Metallization Conference 2001*. Montreal, Quebec.
Kim, Y.T. and H. Sim. 2002. "Characteristics of Pulse Enhanced Atomic Layer Deposition of Tungsten Nitride Diffusion Barrier for Copper Interconnect" (Abstract). *IEIC Technical Report*. vol. 102, No. 178, pp. 115-118.
Elers, Kai-Erik, Ville Saanila, Pekka J. Soininen, Wei-Min Li, Juhana T. Kostamo, Suvi Haukka, Jyrki Juhanoja, and Wim F.A. Besling. 2002. "Diffusion Barrier Deposition on a Copper Surface by Atomic Layer Deposition" (Abstract). *Advanced Materials*. vol. 14, No. 13-14, pp. 149-153.
Van der Straten, O., Y. Zhu, E. Eisenbraun, and A. Kaloyeros. 2002. "Thermal and Electrical Barrier Performance Testing of Ultrathin Atomic Layer Deposition Tantalum-Based Materials for Nanoscale Copper Metallization." *IEEE*. pp. 188-190.
Wu, Z.C., Y.C. Lu, C.C. Chiang, M.C. Chen, B.T. Chen, G.J. Wang, Y.T. Chen, J.L. Huang, S.M. Jang, and M.S. Liang. 2002. "Advanced Metal Barrier Free Cu Damascene Interconnects with PECVD Silicon Carbide Barriers for 90/65-nm BEOL Technology." *IEEE*. pp. 595-598.
Jul. 25, 2003. International Search Report for PCT/US02/24858.
Mar. 30, 2004. Written Opinion for PCT/US02/19062.
Apr. 9, 2004. Written Opinion for PCT/US02/19116.
Apr. 22, 2004. Office Action for U.S. Appl. No. 09/998,372, filed Nov. 30, 2001.
Apr. 28, 2004. Written Opinion for PCT/US02/19117.
Apr. 29, 2004. Written Opinion for PCT/US02/19061.
May 5, 2004. Office Action for U.S. Appl. No. 09/943,955, filed Aug. 31, 2001.
May 5, 2004. International Preliminary Examination Report for PCT/US01/27406.
May 28, 2004. Office Action for U.S. Appl. No. 09/943,383, filed Aug. 31, 2001.
Jun. 3, 2004. Office Action for U.S. Appl. No. 09/928,474, filed Aug. 14, 2001.
Jun. 23, 2004. Office Action for U.S. Appl. No. 10/686,589, filed Oct. 17, 2003.
Jun. 30, 2004. Office Action for U.S. Appl. No. 09/800,980, filed Mar. 8, 2001.
Jul. 15, 2004. Office Action for U.S. Appl. No. 10/172,977, filed Jun. 18, 2002.
Aug. 2, 2004. Office Action for U.S. Appl. No. 10/174,377, filed Jun. 18, 2002.
Aug. 9, 2004. Written Opinion for PCT Serial No. PCT/US02/19063.
Aug. 18, 2004. International Preliminary Examination Report for PCT Serial No. PCT/US02/19116.

Aug. 24, 2004. Office Action for U.S. Appl. No. 10/135,405, filed May 1, 2002.
Aug. 25, 2004. Office Action for U.S. Appl. No. 09/998,384, filed Nov. 30, 2001.
Sep. 9, 2004. Written Opinion for PCT Serial No. PCT/US02/21942.
Sep. 15, 2004. Office Action for U.S. Appl. No. 10/632,107, filed Aug. 1, 2003.
Sep. 16, 2004. International Preliminary Examination Report for PCT Serial No. PCT/US02/24859.
Sep. 29, 2004. Office Action for U.S. Appl. No. 09/363,966, filed Jul. 29, 1999.
Oct. 1, 2004. International Preliminary Examination Report for PCT Serial No. PCT/US03/23964.
Oct. 6, 2004. Office Action for U.S. Appl. No. 10/759,108, filed Jan. 20, 2004.
Oct. 12, 2004. International Preliminary Examination Report for PCT Serial No. PCT/US02/19061.
Nov. 17, 2004. Written Opinion for PCT Serial No. PCT/US01/27407.
Boning, Duane et al. "Run by Run Control of Chemical-Mechanical Polishing." *IEEE Trans.* Oct. 1996. vol. 19, No. 4. pp. 307-314.
Moyne, James et al. "A Run-to-Run Control Framework for VLSI Manufacturing." *Microelectronic Processing '93 Conference Proceedings.* Sep. 1993.
Telfeyan, Roland et al. "Demonstration of a Process-Independent Run-to-Run Controller." *187th Meeting of the Electrochemical Society.* May 1995.
Moyne, James et al. "A Process-Independent Run-to-Run Controller and Its Application to Chemical-Mechanical Planarization." *SEMI/IEEE* Adv. Semiconductor Manufacturing Conference. Aug. 15, 1995.
Moyne, James et al. "Adaptive Extensions to be a Multi-Branch Run-to-Run Controller for Plasma Etching." *Journal of Vacuum Science and Technology.* 1995.
Sachs, Emanuel et al. "Process Control System for VLSI Fabrication.".
Chaudhry, Nauman et al. "Active Controller: Utilizing Active Databases for Implementing Multi-Step Control of Semiconductor Manufacturing." *University of Michigan.* pp. 1-24.
Chaudhry, Nauman et al. "Designing Databases with Fuzzy Data and Rules for Application to Discrete Control." *University of Michigan.* pp. 1-21.
Chaudhry, Nauman A. et al. "A Design Methodology for Databases with Uncertain Data." *University of Michigan.* pp. 1-14.
Khan, Kareemullah et al. "Run-to-Run Control of ITO Deposition Process." *University of Michigan.* pp. 1-6.
Moyne, James et al. "Yield Improvement @ Contact Through Run-to-Run Control.".

Kim, Jiyoun et al. "Gradient and Radial Uniformity Control of a CMP Process Utilizing a Pre- and Post- Measurement Strategy." *University of Michigan.*
Levine, Martin D. 1985. *Vision in Man and Machine.* New York: McGraw-Hill, Inc. pp. ix-xii, 1-58.
Pilu, Maurizio. Sep. 2001. "Undoing Page Curl Distortion Using Applicable Surfaces." *IEEE International Conference on Image Processing.* Thessalonica, Greece.
May 23, 2003. Written Opinion for PCT/US01/24910.
Miller, G. L., D. A. H. Robinson, and J. D. Wiley. Jul. 1976. "Contactless measurement of semiconductor conductivity by radio frequency-free-carrier power absorption." *Rev. Sci. Instrum.*, vol. 47, No. 7, pp. 799-805.
1999. "Contactless Bulk Resistivity/Sheet Resistance Measurement and Mapping Systems." www.Lehighton.com/fabtech/index.html.
2000. "Microsense II Capacitance Gaging System." www.adetech.com.
El Chemali, Chadi et al. Jul./Aug. 2000. "Multizone uniformity control of a chemical mechanical polishing process utilizing a pre- and postmeasurement strategy." *J. Vac. Sci. Technol.* vol .18, No. 4. pp. 1287-1296.
Mar. 5, 2001. "KLA-Tencor Introduces First Production-worthy Copper CMP In-situ Film Thickness and End-point Control System." http://www.kla-tencor.com/j/servlet/NewsItem?newsItemID=74.
2002. "Microsense II—5810: Non-Contact Capacitance Gaging Module." www.adetech.com.
Aug. 8, 2003. PCT International Search Report from PCT/US03/08513.
Oct. 14, 2003. PCT International Search Report from PCT/US02/21942.
Oct. 20, 2003. PCT International Search Report from PCT/US02/19116.
Oct. 23, 2003. PCT International Preliminary Examination Report from PCT/US01/24910.
"NanoMapper wafer nanotopography measurement by ADE Phase Shift." http://www.phase-shift.com/nanomap.shtml.
"Wafer flatness measurement of advanced wafers." http://www.phase-shift.com/wafer-flatness.shtml.
"ADE Technologies, Inc.—6360." http://www.adetech.com/6360.shtml.
"3D optical profilometer MicroXAM by ADE Phase Shift." http://www.phase-shift.com/microxam.shtml.
"NanoMapper FA factory automation wafer nanotopography measurement." http://www.phase-shift.com/nanomapperfa.shtml.
Office Action dated Aug. 22, 2005, from U.S. Appl. No. 10/172, 977.

* cited by examiner

INTEGRATING TOOL, MODULE, AND FAB LEVEL CONTROL

CROSS REFERENCE TO RELATED APPLICATION

This application claims the benefit of U.S. Provisional Applications 60/298,878 and 60/365,770, filed respectively on Jun. 19, 2001 and Mar. 21, 2002, both of which are incorporated herein by reference.

FIELD OF THE INVENTION

The present invention relates generally to semiconductor manufacture. More particularly, the present invention relates to techniques for integrating tool, module, and fab level control in a semiconductor manufacturing process.

BACKGROUND OF THE INVENTION

Present-day semiconductor wafer fabrication factories (or 'fabs') are extremely complex environments that require an extraordinary amount of coordination. For example, a typical fab may consist of hundreds of wafer processing tools, each of which may be responsible for performing one or more of a variety of operations or processes. Thus, where a wafer is processed into items such as logic (e.g., central processing units) or memory (e.g., DRAMs), each tool performs one or more operations or series of operations on the wafer. After a tool performs its operation, the wafer may be forwarded to a downstream tool where additional operations or series of operations may be performed. Each tool may process wafers according to hundreds of distinct processes, with each having hundreds of individual steps. Ultimately, the sum of operations performed by these tools on the wafer results in the final product or the final state of the wafer.

To further complicate matters, each tool may be logically or physically grouped with a number of other tools in one or more modules, submodules, or other functional units. For instance, the tools may be grouped together as a module to provide some related function (e.g., to produce a higher level product) or combination of functions within the fab. Similarly, the tools may be grouped together based on geographical or physical considerations. In any event, the tools in a module or submodule operate in a coordinated fashion to produce a portion of the desired fab final product. The sum of these portions produces the final product. Thus, each functional unit completes one or more jobs on the wafers before they are advanced to any subsequent modules or submodules in the fab.

To manage these functional units (i.e., the fab, modules, submodules and/or tools), any number of controllers may be implemented at each level. Each controller directs its functional unit in performing a process or series of processes on a wafer. The controllers may utilize any number of models to determine parameter targets necessary for producing the functional unit final product. Thus, each model determines the targets that must be obtained by the processes or operations of the functional unit required to obtain the desired product, as specified by an inputted target. The controller then directs the functional unit to perform the operation or series of operations.

These levels of management or control, while helpful in increasing efficiency, add to the complexity of the system. Thus, even in the simplest cases, fabs are extremely complex. Clearly then, the sheer volume of information has made the operation and control of fabs a major problem.

Despite the large volumes of data and multiple levels of control involved in its management, fab management has been accomplished primarily by manual methods. For instance, in the example described above, the targets and other inputs have traditionally been entered manually by, for example, fab technicians and/or process engineers. In this manner, many of the controller responsibilities were assumed by these technicians and engineers. To implement a change to a final product, new targets are entered into the functional units at each level by these technicians. Thus, with a new fab product, alterations (e.g., inputting a new target) are made manually to the product parameters at all module, submodule, and tool level functional units.

In a similar manner, changes to the operating state of a tool (or other functional unit) due to for example normal wear, also require modifications to the targets of the functional unit by the process engineers. Also, in addition to the changes at the functional unit, modifications must be made to higher level and surrounding functional units (i.e., other modules and tools) to account for these changes as well. Like the above, the process engineers must also make these target modifications manually.

To alter the final product of a wafer fab, a process engineer first identifies the new product and its target parameters. Subsequently, each of the functional units of the fab is ordered to produce a result, which when combined with the results of the other functional units of the fab, produces the final product. Hence, each module, submodule, and tool must be told, by a technician or engineer, what to do and how to do it. Each functional unit requires a process engineer to enter the target or desired result of the functional unit. In the past, controllers capable of generating certain targets above the tool level have been implemented. However, no techniques have been developed for forwarding information to the tool level or for generating tool level targets. Thus, at the tool level, a target wafer output (i.e., a desired result after processing by an individual tool), such as a required thickness, must be identified and entered by the process engineer. The tool may then identify or select a recipe (i.e., a set of predefined process parameters required to effectuate a processing outcome) for obtaining the target wafer output (thickness in this case). Thus, with each alteration to a final product of a fab, hundreds if not thousands of modifications must be made by these technicians or engineers.

What is therefore needed is a technique for automating these and similar modifications at the functional units. Instead of entering target parameters or implementing modifications at each level, what would be highly useful is a technique that can be utilized to implement control at one functional unit level, which in turn controls functional units at other or lower levels. For example, it would be highly useful if control could be implemented at a single functional unit for the entire fab. In this manner, a product specification may be entered at one level, thus allowing targets at other levels to be generated automatically.

SUMMARY OF THE INVENTION

The present invention addresses the problems described above by processing semiconductor wafers in a fab in a manner that integrates control at multiple functional unit levels. Examples of these levels of functional units could include fabs, modules, tools, and the like. To facilitate one or more embodiments of the present invention (as envisioned by one or more embodiments thereof), one or more first functional unit property targets (for producing a given semiconductor device or portion thereof) are initially received at a functional unit. The functional unit property targets are utilized to generate a number of other functional unit property targets. For example, it may generate a number of tool targets for any number of tool level functional units. From there, the tool targets are forwarded to the corresponding tool level functional units. At these tool level functional units, a number of tool recipes, each of which define a number of process setpoints, may be generated by processing the tool targets. The process setpoints define a number of parameters which must be satisfied in order to attain the corresponding tool targets.

In one or more embodiments of the present invention, the tool targets and tool recipes are determined in part by utilizing feedback information. Examples of such feedback information include functional unit states and measurements of controlled parameters. In at least some of these embodiments, at least one of the tool level functional units includes an integrated metrology device or sensor for measuring the controlled parameters.

BRIEF DESCRIPTION OF THE DRAWINGS

Various objects, features, and advantages of the present invention can be more fully appreciated as the same become better understood with reference to the following detailed description of the present invention when considered in connection with the accompanying drawings, in which.

DETAILED DESCRIPTION OF THE INVENTION

In accordance with one or more embodiments of the present invention, semiconductor wafers are processed in a fab in a manner that integrates control at multiple functional unit levels. Examples of these levels of functional units include fabs, modules, tools, and the like. Examples of modules include physical vapor deposition (PVD) modules, copper wiring modules, dep-etch modules, etc. Examples of tools include chemical vapor deposition (CVD), chemical mechanical planarization (CMP), etch, copper barrier seed, tools etc. According to one or more embodiments of the present invention, any number of functional unit property targets are initially received at a functional unit. Examples of these targets include a set of electrical parameters associated with a product, thickness uniformity, sheet resistance, film thickness, uniformity profiles, trench depth, etc. The functional unit property targets are utilized to generate a number of tool targets for any number of tool level functional units. From there, the tool targets are forwarded to the corresponding tool level functional units. At these tool level functional units, a number of tool recipes, each of which define a number of process setpoints, may be generated by processing the tool targets. The process setpoints define a number of parameters which must be satisfied in order to attain the corresponding tool targets. In addition, in one or more embodiments, the tool targets and tool recipes are determined utilizing any number of types of feedback information. Some examples include functional unit states and measurements of controlled parameters. For instance, actual measured processing results (measured by, e.g., an in situ sensor or the like) may be fed back to a tool or other functional unit and utilized in generating subsequent tool recipes. Likewise, the condition of a tool or other functional unit (e.g., the condition of a polishing pad) may be fed back to a tool for similar purposes.

Figure 1:
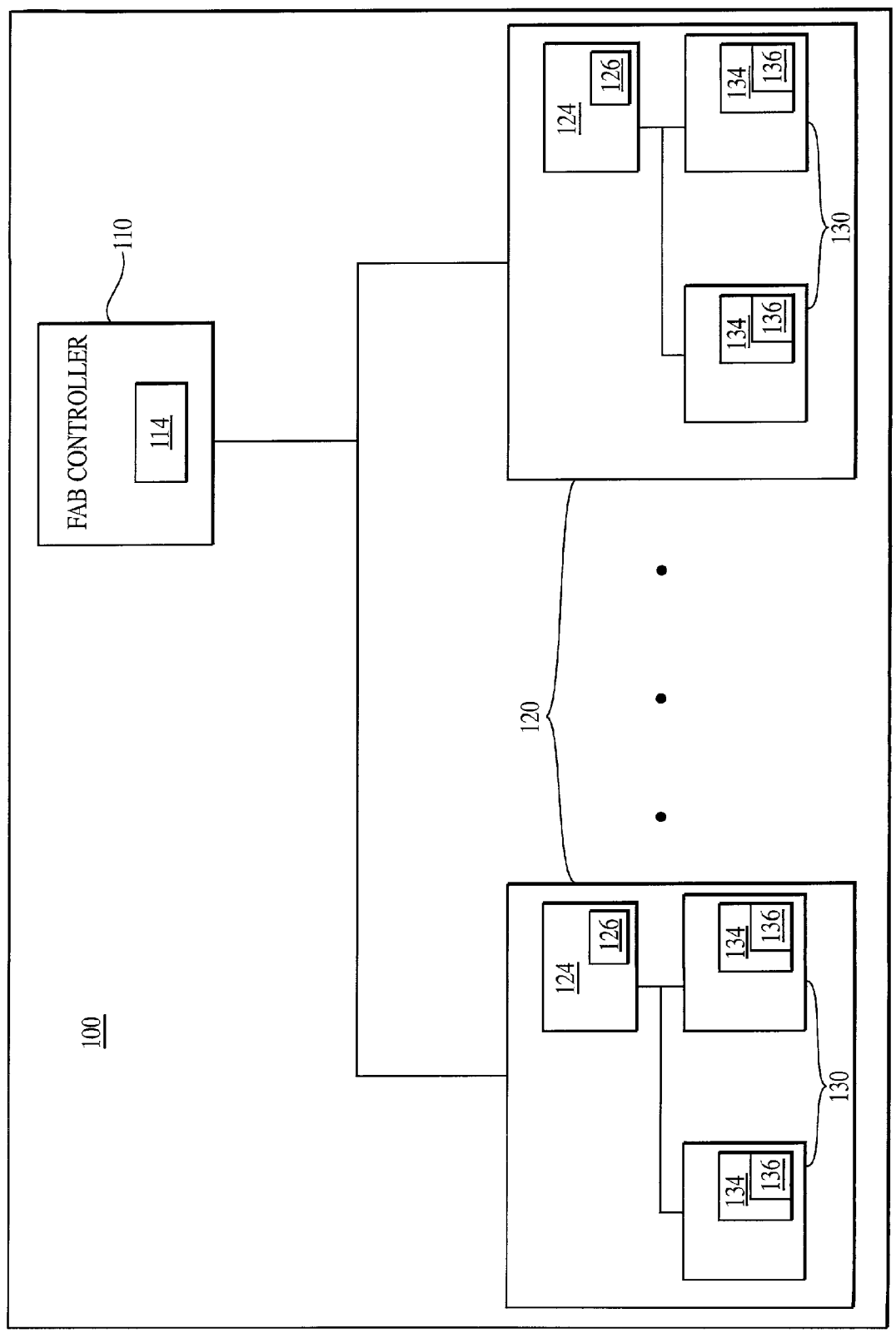
FIG. 1 depicts one example of a block diagram representation of a semiconductor manufacturing facility or fab utilizable for implementing one or more aspects of the present invention.

FIG. 1 depicts one example of a block diagram representation of a semiconductor manufacturing facility or fab 100 utilizable for implementing one or more aspects of the present invention. Fab 100 may be used to process semiconductor wafers to produce any number of semiconductor products, such as DRAMs, processors, etc. As shown in FIG. 1, fab 100 includes, among other components, any number tools 130 grouped logically or physically into any number of modules 120. Modules 120 process wafers to produce a module final product and operate in conjunction with each other to produce a fab final product. Examples of modules include physical vapor deposition (PVD) modules, copper wiring modules, dep-etch modules, and the like. Thus, wafers are passed from one module to another where any number of operations may be performed, the ultimate goal of which is to arrive at the fab final product.

Referring again to FIG. 1, each module includes any number of tools 130. In a manner analogous to the above, tools 130 process wafers to produce a tool final product and operate in conjunction with each other to produce a module final product. Examples of tools include chemical vapor deposition, chemical mechanical planarization tools, etch, copper barrier seed, ECP tools, and the like. Thus, similar to the module level, wafers are passed from one tool to another where any number of operations may be performed, the ultimate goal of which is to arrive at the module final product. In one or more embodiments of the present invention, at least some of the tools can be "cluster tools" (or the like) capable of performing multiple functions. In general, it should be understood that the functions performed at various levels may be interchangeable, such that e.g., the module level of a particular embodiment of the present invention may be performed at, e.g., the tool level of another embodiment of the present invention, and vise versa.

Tools 130, modules 120, and fab 100 serve as examples of the distinct levels of functional units of the present invention. In this example, fab 100 sits at the top of the hierarchy as the highest level functional unit. At the next level, modules 120 serve as intermediate level functional units. Tools 130 thus operate as the lowest level functional units in this example. Although three levels of functional units are depicted in this example, it is to be understood that any number of levels of functional units may be utilized without departing from the scope of the present invention. For example, any number of "supermodule" (e.g., a number of modules grouped together within a fab), "submodule" (e.g., a number of tools grouped together within a module), and/or "subtool" (e.g., a number of chambers operating in conjunction within a tool) level functional units may also be implemented.

In accordance with one or more embodiments of the present invention, each functional unit is associated with at least one controller. These controllers are responsible for directing the operation of their associated functional units. Based on a desired or target product, as defined by any number of parameters, the controller may direct its functional unit to perform the tasks or operations required to obtain those desired targets. The controllers may be stand-alone computing units or integrated within one or more of the functional units.

Generally speaking, each controller utilizes any number of models to obtain these targets. As known to those of ordinary skill in the art, the models are typically created through physical understanding, experimentation, and/or previous observation. The models optimize or determine the processes or operations required to produce an output that is within an acceptable range of the target. As mentioned above, these models receive as inputs the target and any number of other inputs or information, such as feedback from previous runs or the runs of other functional units and/or state information from the functional units. The models subsequently determine or identify the processes or operations (as defined by, for example, a set of lower level targets) believed to be necessary to achieve the desired targets.

Referring again to FIG. 1, fab 100 includes fab controller 110, which in turn has implemented therein fab-wide model 114. Fab-wide model 114 receives as input, for example, the targets of a fab final product (i.e., the specifics or characteristics defining the final product). Examples include a set of electrical parameters associated with a memory or logic unit. In addition to these final product specifics, feedback from and state information concerning fab 110, modules 120 and/or tools 130 may also be received as input. Subsequently, fab-wide model 114 generates the module level targets (i.e., the desired results of processing by each module) used to achieve or obtain the fab level final product. Examples of such module level targets can include a thickness uniformity, sheet resistance, etc.

In a similar manner, modules 120 include module controllers 124, which in turn have implemented therein module models 126. Module models 126 receive as input from fab controller 110 one or more module targets. In accordance with one or more embodiments of the present invention, and as discussed above, these targets may be generated by fab-wide model 114 as results to be used for obtaining the fab final product. In addition to these targets, module model 126 may also accept as inputs, feedback and/or state information from tools 130 and other modules 120. After receiving such inputs, module model 126 determines or identifies the tool level targets (i.e., the desired results of processing by each tool) required to achieve or obtain the module level final product. Examples of tool level targets can include film thickness, uniformity, profiles, via depth, trench depth, etc.

Tools 130 include tool controllers 134, which in turn have implemented therein tool models 136. One example of a tool controller includes iAPC offered by Applied Materials, Inc. of Santa Clara, Calif. During processing, tool models 136 receive as input from module controller 124 one or more tool targets. In accordance with one or more embodiments of the present invention, and as discussed above, these targets may be generated by module model 126 as a result to be used for obtaining the module final product. In addition to these targets, tool model 136 may also accept as inputs, feedback and/or state information from tools 130.

After receiving such inputs, tool model 136 generates a recipe for obtaining the wafer characteristics believed to be required to achieve or obtain the tool level final product. These recipes constitute a set of predefined process parameters required to effectuate a tool processing outcome. For example, a typical recipe may dictate one or more setpoints for any number of processes required to effect a desired tool output. Thus, a recipe may identify the required temperature, pressure, power, processing time, lift position, and flow rate of a material needed to produce a particular wafer result. An example of a technique utilizable for generating recipes is described in U.S. patent application Ser. No. 09/998,372, filed on Nov. 30, 2001, assigned to Applied Materials, Inc., of Santa Clara, Calif., which is incorporated herein by reference.

Figure 2:
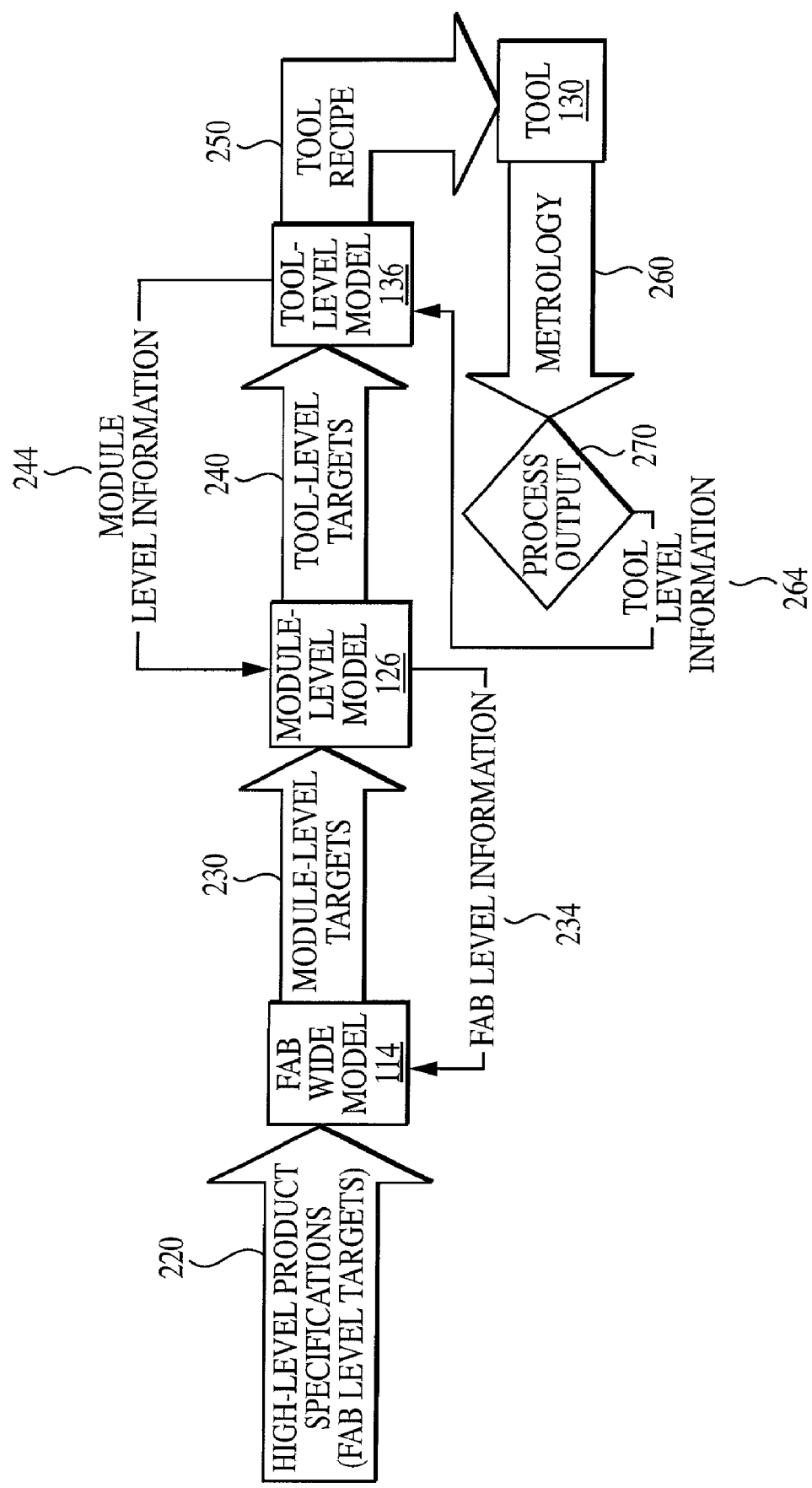
FIG. 2 depicts one example of a high level process implementable for integrating control of multiple levels of functional units.

Referring to FIG. 2, one example of a high level process implementable for integrating (in conjunction with FIG. 1), control of multiple levels of functional units is illustrated. In accordance with one or more embodiments of the present invention, processing commences with high-level product specifications being entered into fab wide model 114 via fab controller 110 (STEP 220). As an example, and as discussed above, these high-level product specifications may describe the characteristics of a desired fab final product.

From there, fab wide model 114 generates a number of module level targets, which are to be used for obtaining the fab final product as defined by the high level product specifications entered earlier. These targets are forwarded to any number of module controllers 124 for use by the module level models 126 implemented therein (STEP 230). These module level targets define or characterize a module level final product to be generated by the corresponding module. Thus, the sum of processing by each module in a fab, with each module producing a result satisfying an associated module level target, produces that fab's final product.

One or more embodiments of the present invention also contemplate utilizing, in addition to the inputted high level product specifications, lower level information to generate these module level targets (STEP 234). For example, fab wide model 114 may also utilize state information from lower level or other functional units (e.g., the fab modules and/or tools) and actual measured parameters from previous processing runs (from, e.g., the fab, modules and/or tools) to generate module targets. Consideration of these additional inputs by fab wide model 114 may increase the accuracy of the predicted module level targets.

As mentioned above, the module level targets generated by fab wide model 114 are subsequently forwarded to the module level models 126, where a number of tool level targets are generated (STEP 240). Similar to the module level targets, the tool level targets define the characteristics for producing a higher level product (i.e., module level in this case). Thus, the sum of processing by each tool in a module, with each tool product satisfying an associated tool level target, produces that module's final product.

Like processing at the fab level, one or more embodiments of the present invention also contemplate utilizing, in addition to the forwarded module level product targets, additional information to generate these tool level targets (STEP 244). For example, module model 126 may also utilize state information from lower level or other functional units (e.g., tools and/or other modules) and actual measured parameters from previous processing runs (from e.g., the module and/or tools) to generate tool level targets. Consideration of these additional inputs by module model 126 may increase the accuracy of the predicted tool level targets.

After being generated by module level model 126, the tool level targets are forwarded to tool controllers 134 for use by tool level models 136 in controlling tools 130 (STEP 240). More specifically, tool level model 136 generates a recipe based on the tool level targets received from the module level (i.e., module level model 126). As mentioned above, these recipes constitute a set of predefined process parameters required to effectuate a tool processing outcome (i.e., a tool final product) for each tool. Generally speaking, the recipes dictate one or more setpoints for any number of processes required to effect the tool level target received from the module level.

Once generated, the recipes are downloaded onto tool 130 for use in controlling the corresponding tool processes (STEP 250). In accordance with one or more embodiments of the present invention, during or immediately after tool processing, any number of sensors (e.g., inline, integrated or in situ sensors) and/or other metrology tools may be utilized to measure wafer or product properties of the tool process output 270 (i.e., measurements of controlled parameters) (STEP 260). As noted above, these properties depend on the type of tool(s) at issue, and may include film thickness, uniformity, etc. The resulting tool level information may be fed back to tool model 136 (STEP 264).

In one or more embodiments of the present invention, these wafer or product properties may then be forwarded to tool level model 136 for use in generating subsequent tool recipes. Consideration of these additional inputs by tool level model 136 may increase the accuracy of the recipes generated by tool level models 136.

Figure 3:
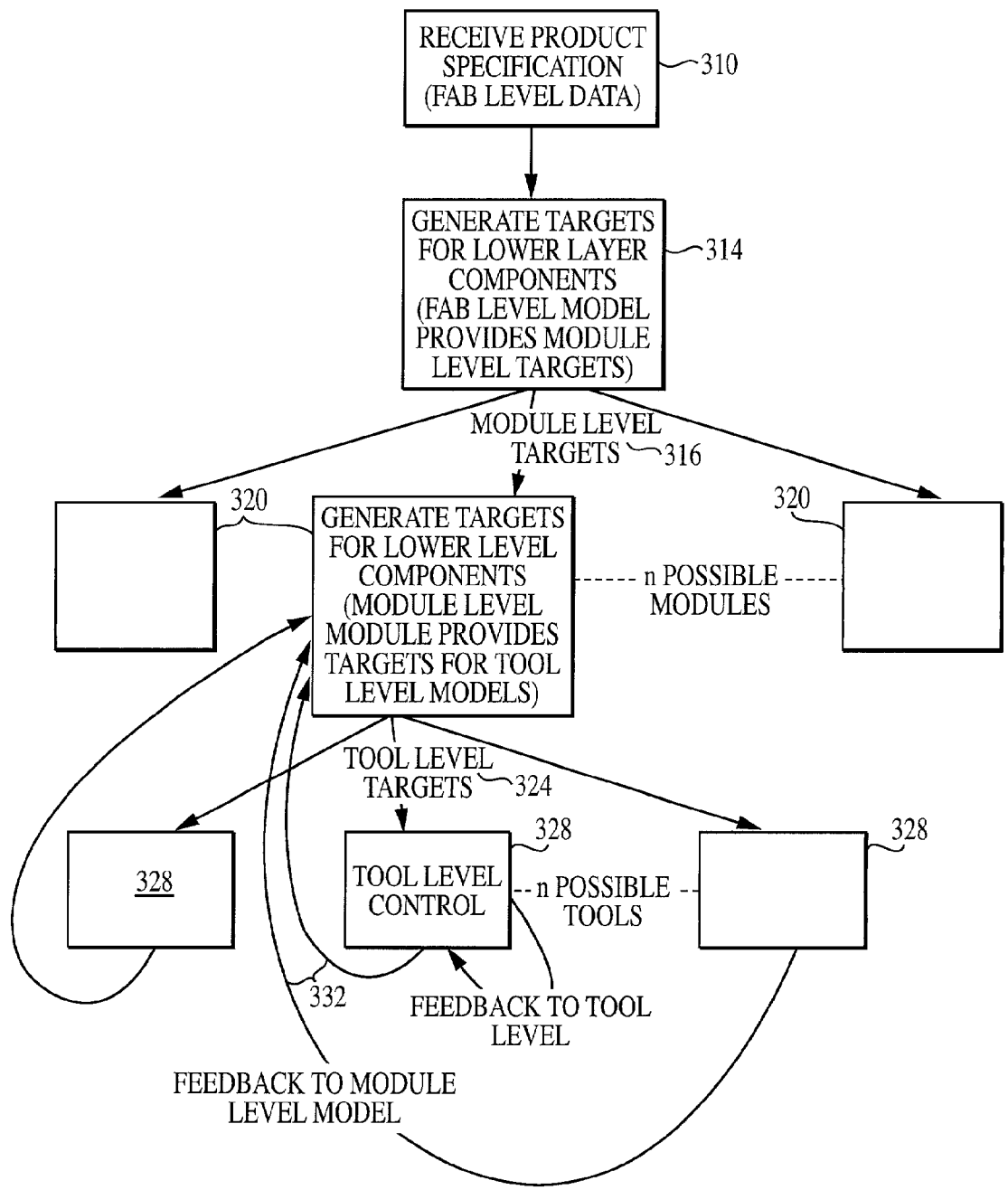
FIG. 3 depicts one example of a process implementable for integrating control of multiple levels of functional units with multiple functional units at each level.

FIG. 3 (in conjunction with FIG. 1) illustrates an example of a process implementable for integrating control of multiple levels of functional units with multiple functional units at the module and tool level. In particular, a technician or process engineer starts the process by entering a high-level product specification into fab controller 110 at the fab level (STEP 310). Again, as discussed above, these high-level product specifications may describe the characteristics of a desired fab final product.

In fab controller 110, fab wide model 114 generates a number of lower level functional unit targets (STEP 314). In this example, module level targets are generated by fab wide model 114. These lower level functional unit targets are then forwarded to any number of, for example, module controllers 124 (STEP 316). As mentioned above, these module level targets, when taken together, represent the results of the processes to be used to produce the fab final product.

At module controllers 124, associated module models 126 generate targets for lower level functional units (STEP 320). In this example, tool level targets are generated. These tool level targets, when combined, represent the parameters to be used to produce the module final product. The tool level functional unit targets generated by the module level models are then forwarded to any number of, for example, tool controllers 134 (STEP 324).

From there, the tool level targets may be utilized by tool level models 136 to dictate the behavior of tools 130 (STEP 328). In one example, as discussed above, tool level model 136 generates a recipe based on the tool level target received from the module level (i.e., module level model 126), which in turn is used to direct the processing or operation of tool 130.

In accordance with one or more embodiments of the present invention, and as discussed above, feedback from the functional units may be forwarded for use in the modeling processes. For example, wafer properties measured at the tool level may be forwarded to module controllers 124 for use in generating subsequent tool level targets (STEP 332). Similarly, properties measured at the module (e.g., a thickness uniformity of a wafer) and/or tool (e.g. a film thickness of a wafer) level may be forwarded to fab controller 124 for use in generating subsequent module level targets (not shown).

Communication between functional units (e.g., the transfer of information including functional unit targets, state information, measurements of controlled parameters, etc.) may be facilitated utilizing any known techniques. For instance, standard communication networks may be implemented utilizing, for example, transmission control protocol (TCP) and Internet protocol (IP). Thus, according to one or more embodiments of the present invention, tool level targets generated at one module may be transmitted from a module controller associated with that module to a lower level function unit, such as a tool, via TCP/IP. In a similar manner, data from one functional unit may be transmitted to other functional units using similar and analogous techniques.

Figure 4:
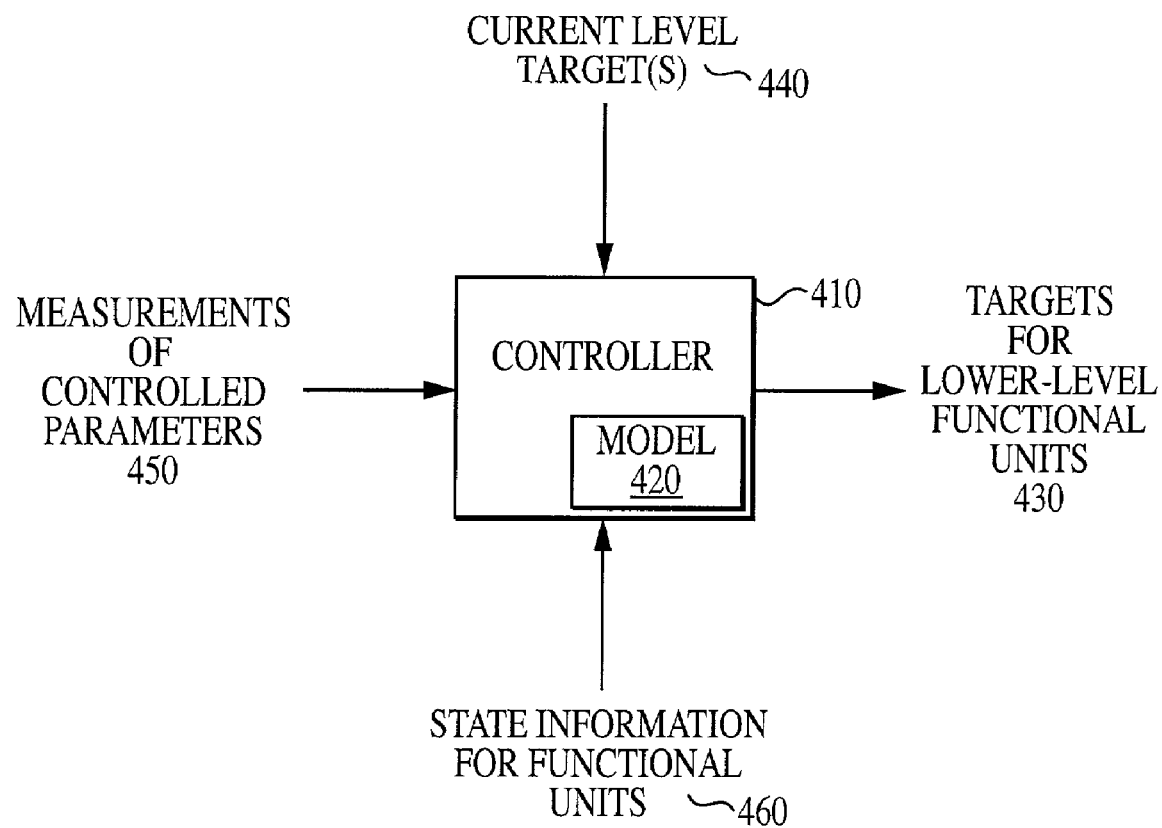
FIG. 4 depicts one example of a process utilizable for generating targets for lower level functional units.

Referring to FIG. 4, one example of a process utilizable for generating targets for lower level functional units is illustrated. In accordance with one or more embodiments of the present invention, and as mentioned above, targets for these functional units are generated by a model utilizing a number of inputs. In the example shown in FIG. 4, a model 420 (e.g., a fab wide, module, or tool model) is implemented on an associated controller 410. As discussed above, controller 410 and model 420 are responsible for controlling an associated functional unit.

In accordance with one or more embodiments of the present invention, model 420 generates one or more targets for lower level functional units (STEP 430). The targets are generated by model 420 based on a number of inputs. One input includes one or more current level targets (STEP 440). The current level targets are targets requested of the functional unit corresponding to controller 410 by, e.g., a higher (or parallel) level functional unit. The current level targets are expected to be achieved upon completion of each of the lower level targets generated by model 420 in STEP 430. Stated in other words, each of the lower level targets generated by model 420 in STEP 430 will be achieved in order to obtain the current level target.

In addition to the current level target entered in STEP 440, other inputs may also be considered by model 420 in generating targets for lower level functional units. For example, measurements of controlled parameters (i.e., the actual parameters measured after processing by a functional unit) may be considered (STEP 450). Examples of these measurements include a wafer thickness, profile, etc. taken after processing at a functional unit. Similarly, state information for other functional units may be considered (STEP 460). One example of this type of state information includes the condition of a pad in a CMP tool. Thus, a functional unit may receive and utilize in subsequent processes information pertaining to, e.g., whether a pad is new or nearly worn out.

Figure 5:
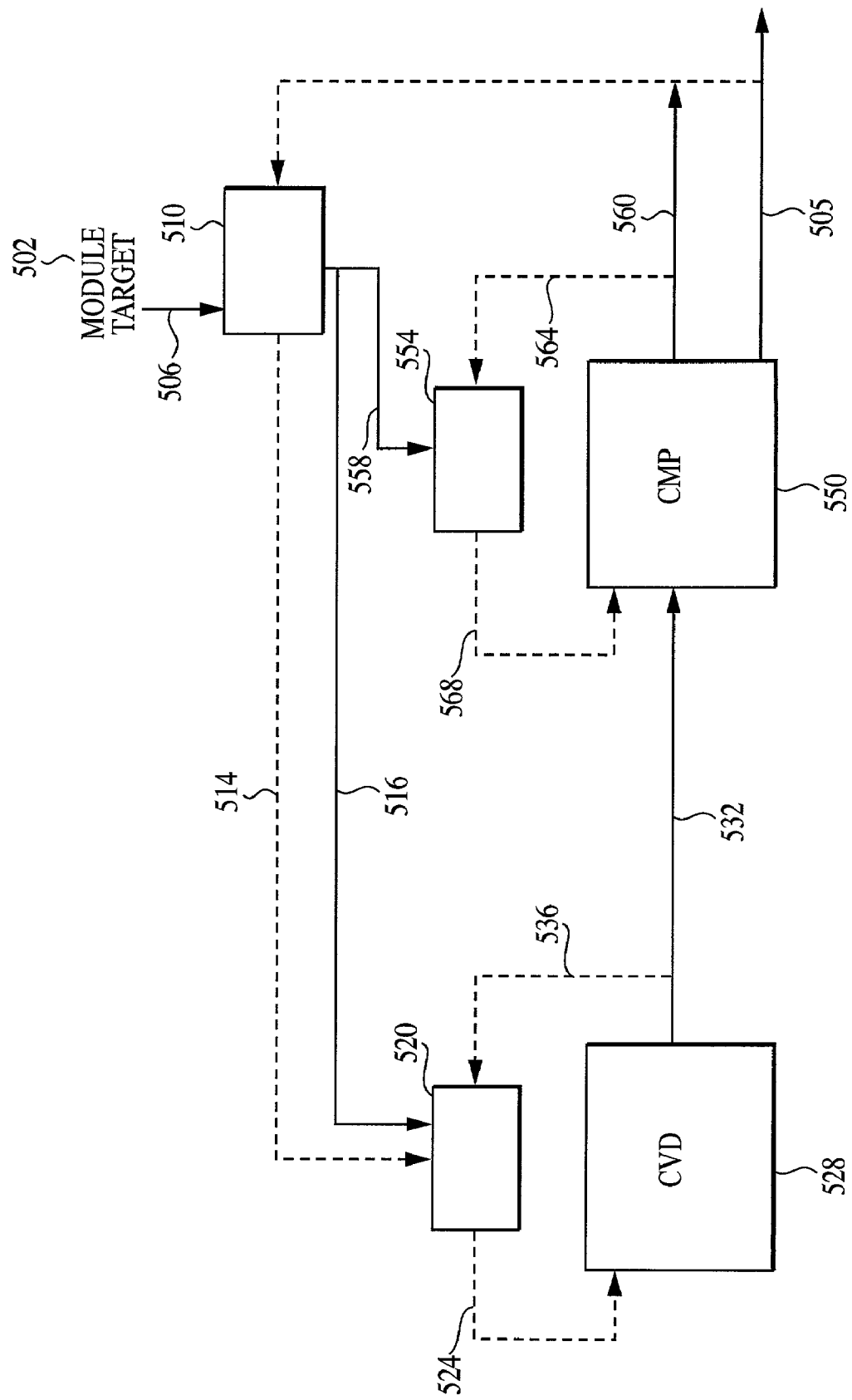
FIG. 5 depicts one example of an application of the process of one or more embodiments of the present invention in an inter-layer dielectric (ILD) module.

FIG. 5 depicts one example of an application of the process of one or more embodiments of the present invention in an inter-layer dielectric ILD module. In this case, the technique of the present invention (i.e., the integration of multiple levels of control) is implemented in the ILD module utilizing two processing tools. In the example depicted in FIG. 5, CVD tool 528 and CMP tool 550 are utilized in conjunction with one another to obtain a module final product 505. More specifically, and in accordance with one or more embodiments of the present invention, module final product 505 is attained by using one tool (e.g., CVD tool 528) to assist in obtaining a tool target at a downstream tool (e.g., CMP tool 550).

In the example shown in FIG. 5, processing commences with a higher level controller (not shown) forwarding a module target 502 to an ILD module controller 510 (STEP 506). As discussed above, this target is generated by the higher level controller for purposes of obtaining module final product 505 and, ultimately (and in conjunction with other module final products), a final product associated with the higher level functional unit.

Subsequently, tool targets are generated by module controller 510 via, for example, a module model. As discussed above, the results of the tool operations (i.e., the final products of CVD tool 528 and CMP tool 550) may be summed to produce module final product 505. In this example, the target profiles of seven annular regions of a wafer are generated by module controller 510 and forwarded to a CVD tool controller 520 (STEP 514) and CMP tool controller 554 (STEP 558). In addition, optimal profiles for CMP tool 550, as determined by module controller 510 are also forwarded to CVD tool controller 520 (STEP 516). Thus, information concerning a downstream tool (e.g., CMP tool 550) is forwarded to an upstream tool (e.g., CVD tool 528) to assist in producing the downstream tool's final product and, ultimately, a module final product.

Based on the target profiles received from module controller 510, and using other optional information and inputs, including measured control outputs from, for example, previous CVD tool runs, any state information from CVD tool 528 or CMP tool 550 (or other tools), and optimal downstream tool information (received in STEP 516), CVD tool controller 520 identifies a recipe for attaining the desired target profiles (STEP 524). As described above, this recipe directs CVD tool 528 to operate in a manner expected to produce the desired target profiles. From there, CVD tool 528 performs its operations or series of operations on the wafer and, in this case, produces a wafer with seven annular regions having profiles within an acceptable limit of the target profiles (STEP 532).

In accordance with one or more embodiments of the present invention, the actual results (i.e., the measured controlled outputs) of the CVD processing are measured and fed back to CVD tool controller 520 for use in optimizing subsequent runs (STEP 536). Specifically, the actual measured controlled outputs may be measured using integrated metrology tools such as, for example, in situ or other sensors integrated within the CVD tool. By doing so, the technique of the present invention may be utilized to integrate control of multiple levels of functional units on a wafer to wafer basis.

After processing by the CVD tool, the wafer being processed is forwarded to a downstream tool (i.e., CMP tool 550) for additional processing. In accordance with one or more embodiments of the present invention, and as mentioned above, at this point, the operations performed on the wafer have been optimized, to some extent, for CMP tool 550 by CVD tool 528. Thus, the final product of the upstream tool (i.e., CVD tool 528) has been produced, at least to some extent, according to the requirements of the downstream tool (i.e., CMP tool 550).

At CMP tool 550, processing is performed on the wafer to produce a tool final product (STEP 560). As discussed above, this product, when taken together or summed with the final products of the other tools in the module (e.g., CVD tool 528) results in module final product 505. In this example, the module final product includes a region thickness (or uniformity) falling within a particular range.

Processing at CMP tool 550 occurs in a manner similar to CVD tool 528. Specifically, tool targets forwarded by module controller 510 to CMP tool controller 554 (in STEP 558), and, for example, previous CMP tool runs as measured by, for example, any number of sensors or other metrology tools (STEP 564), and any state information from CVD tool 528 or CMP tool 550 (or other tools) are utilized by CMP tool controller 554 in identifying a recipe for attaining the desired target profiles (STEP 568). This recipe may then be utilized to direct the processing performed by CMP tool 550. The final product of CMP tool 550 then is summed with the final products of the other tools in the module (e.g., CVD tool 528) and results in module final product 505.

In accordance with one or more embodiments of the present invention, any number of techniques may be utilized to construct models such as, for example, module level models. One or more embodiments of the present invention contemplate generating targets (i.e., constructing models) at the various functional levels utilizing design of experiment techniques or via knowledge of the functional unit physics or empirical models. Furthermore, although the examples described below discuss the construction of module level models, it is to be understood that the embodiments of the present invention are applicable to the construction of the models of other levels including, for example, fab wide level models and the like.

In one example, module-level experiments derived from design of experiments (DOE) based techniques may be used to construct the models. Generally speaking, DOE based techniques refer to a methodology where a set of experiments are determined to optimally provide information for developing a model or specific correlation structure. Thus, the models may be generated based on, for example, experimentation, previous observation, or knowledge of the desired results. This example is particularly appropriate at the module level, where the output of the module is a function of the output of the tools of the module.

Specifically, utilizing knowledge (via, e.g., a model) that relates tool recipe parameters to controlled outputs previously determined by DOE techniques or other empirical mechanisms, input targets (at, e.g., the module level) are varied and processed through the individual tool models of the module. In addition, information (e.g., state information or measurements) from one tool may be fed forward to other tools. Subsequently, the final product of the module may be determined based on each of the final products of the individual tools. Then, based on these input targets and resulting outputs (and the relationships therebetween), a model relating tool targets to module final products may be obtained.

One specific example of the above-described approach relates to a PMD module (which as discussed above includes one or more CVD and CMP tools). One goal of PMD modules is to maintain the flatness of a post CMP profile. The inputs in this case include a set of targets for the CVD tool for generating a thickness profile of a wafer, which in turn is forwarded for processing by the CMP tool. The module final product, then, includes the profile after polishing by the CMP tool. The model thus is constructed (i.e., any targets may be generated) by inputting a number of distinct profiles from the CVD tool into the CMP tool model and obtaining each of the different post profiles. Accordingly, the relationship between the incoming CVD profile and the post CMP profile can be identified to construct the module level model.

Another example of a process utilizable for constructing models (i.e., generating targets at the various functional levels) is now described with reference to FIG. 6. Specifically, targets in the models may be generated based on constraints derived from known relationships between inputs, functional unit physics, and/or empirical models. In this example, a top down approach, with information flowing down from the high level specification to lower level requirements, is utilized. As with the example described above, the technique assumes an understanding of the physical (i.e., functional unit physics) and empirical relationships (i.e., empirical models) between tool performance and behavior and module output. More specifically, functional unit physics relate to the study of physical relationships that govern the performance of integrated circuits while empirical models relate to quantitative models that are developed based on correlations between observed variables.

Figure 6:
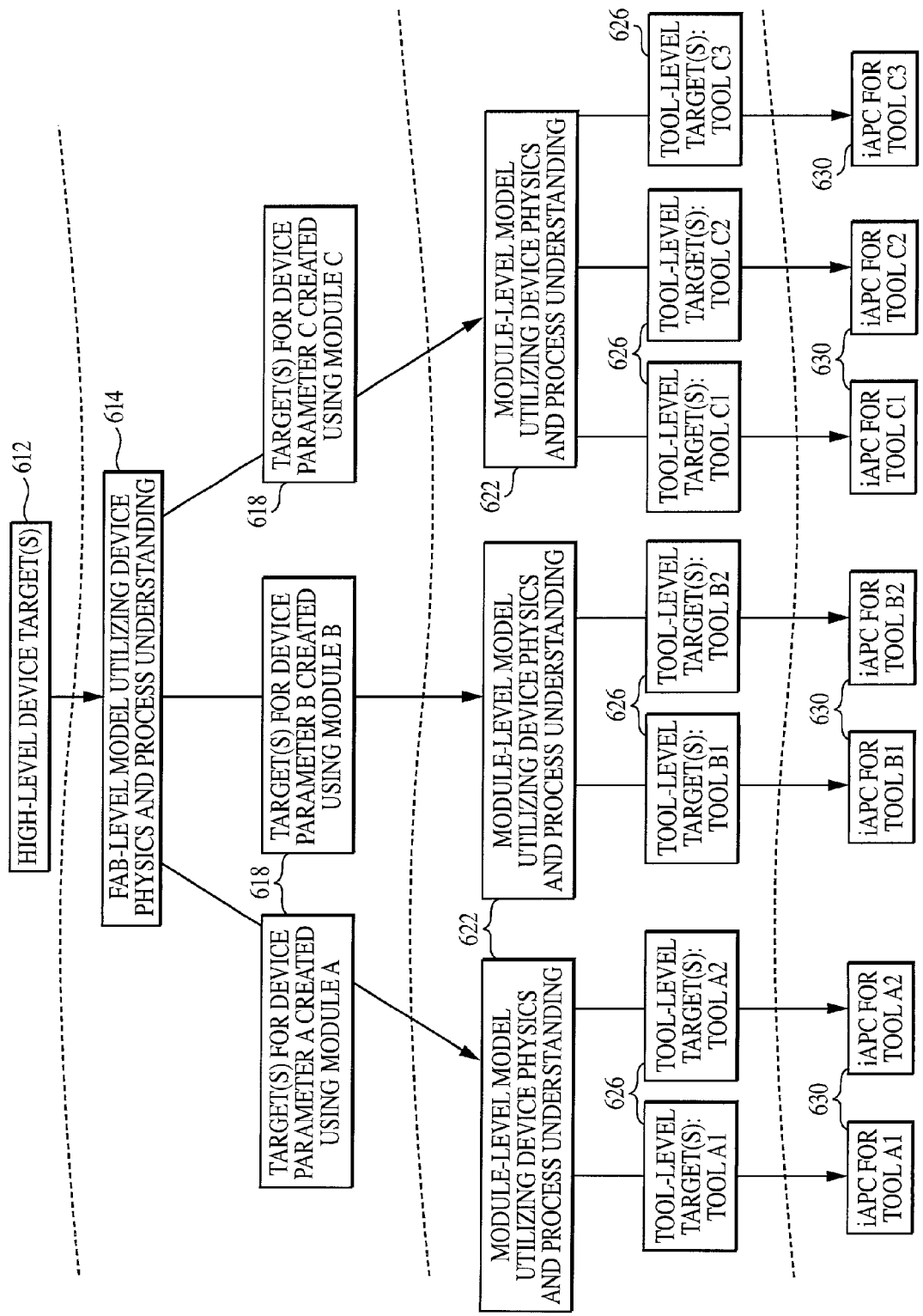
FIG. 6 depicts one example of a process utilizable for constructing models (i.e., generating targets at various functional levels)

As shown in FIG. 6, one or more high level device targets are entered into the fab wide controller (STEP 612). One example of such a high level device target includes a clock speed. This clock speed relates, in a known manner, to a number of wafer characteristics including, for example, a resistance-capacitance (RC) time constant. In addition, a number of design constraints may be obtained utilizing these relationships based on known technological capabilities. Examples of these constraints include minimum achievable film dielectric constants, an achievable critical dimension (CD) control, a minimum copper thickness that can be successfully processed, and/or an achievable aspect ratio for a via chain resistance. In accordance with one or more embodiments of the present invention, these constraints may then be used to generate obtainable targets at the various functional unit levels (i.e., to generate models at various functional unit levels).

Once such constraints have been identified, they may be incorporated into one or more functional unit levels (i.e., fab, module and/or tool levels) of the present invention. For instance, in the above example, a specific resistance for a wafer may be known based upon the inputted clock speed and any dielectric constants may be available based on technological capabilities. Subsequently, fab level targets for a particular device parameter or structure such as resistance and capacitance can be derived using a combination of physical and empirical knowledge of the fab process and design constraints (STEP 614). For example, a resistance may be determined using a known via chain resistance and a snake resistance to be obtained (via e.g., the relationship: R=1/snake resistance+1/via chain resistance+other contributing factors). Similarly, a capacitance may be determined using the known dielectric constant (via e.g., the relationship: capacitance=dielectric constant*area/depth). From there, lower level targets (e.g., at the module level) such as snake resistance and via chain resistance can be determined using the higher level targets (i.e., resistance and capacitance) (STEP 618). These targets can be used to generate targets for various modules such as dep-etch and/or copper wiring modules (STEP 622). In a similar manner, the module targets can be further broken down to individual tool level processes such as BLOk™, Black Diamond™, nitride, or fluorinated silica glass (FSG) deposition processes, dishing and erosion for CMP or deposition thickness for electroplating (STEP 626). Finally, as discussed above, the tool targets may be used to identify tool recipes for directing the individual tools (STEP 630). Thus, information such as fab level specifications are driven down for use by lower level functional units and design constraints are driven bottom up based on the individual tool processing capabilities.

Figure 7:
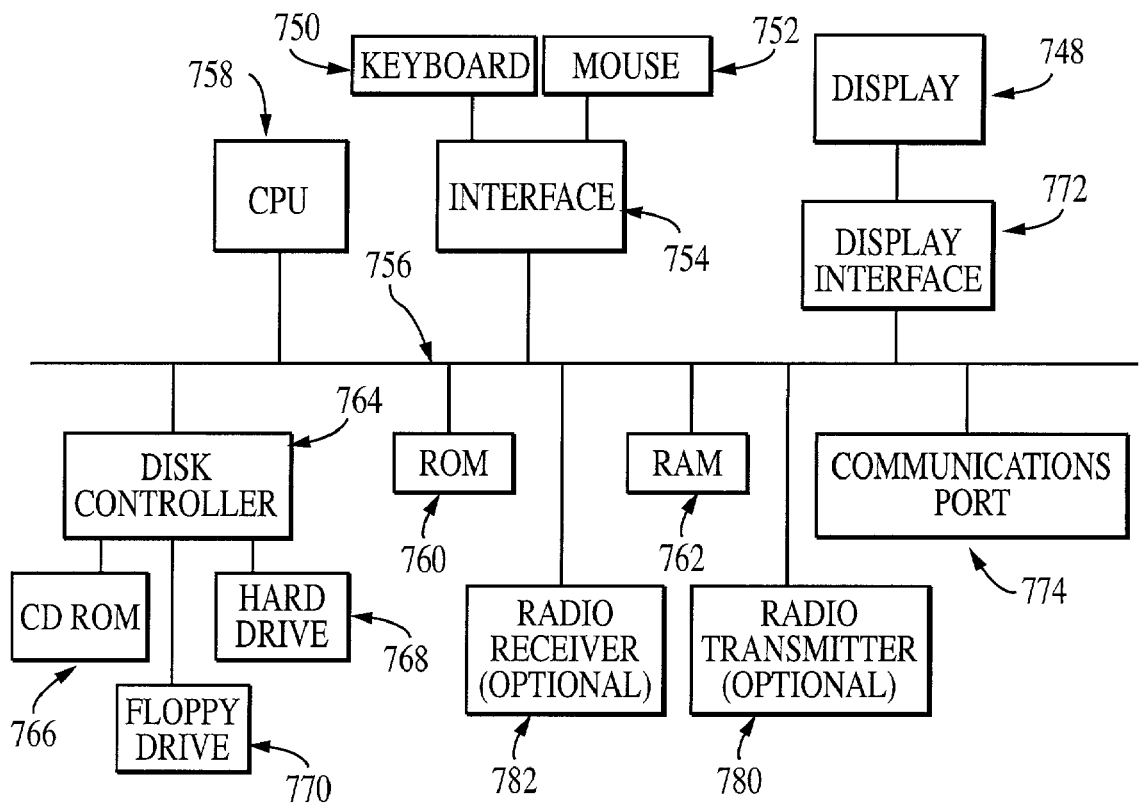
FIG. 7 is a high-level block diagram depicting aspects of computing devices contemplated as part of and for use with one or more embodiments of the present invention.

FIG. 7 illustrates a block diagram of one example of the internal hardware of any of the controllers utilized to implement the models discussed above, examples of which include any of a number of different types of computers such as those having Pentium™ based processors as manufactured by Intel Corporation of Santa Clara, Calif. A bus 756 serves as the main information link interconnecting the other components of the system. CPU 758 is the central processing unit of the system, performing calculations and logic operations required to execute the processes of the instant invention as well as other programs. Read only memory (ROM) 760 and random access memory (RAM) 762 constitute the main memory of the system. Disk controller 764 interfaces one or more disk drives to the system bus 756. These disk drives are, for example, floppy disk drives 770, or CD ROM or DVD (digital video disks) drives 766, or internal or external hard drives 768. CPU 758 can be any number of different types of processors, including those manufactured by Intel Corporation or Motorola of Schaumberg, Ill. The memory/storage devices can be any number of different types of memory devices such as DRAM and SRAM as well as various types of storage devices, including magnetic and optical media. Furthermore, the memory/storage devices can also take the form of a transmission.

A display interface 772 interfaces display 748 and permits information from the bus 756 to be displayed on display 748. Display 748 is also an optional accessory. Communications with external devices such as the other components of the system described above, occur utilizing, for example, communication port 774. For example, port 774 may be interfaced with a bus/network linked to a CMP tool. Optical fibers and/or electrical cables and/or conductors and/or optical communication (e.g., infrared, and the like) and/or wireless communication (e.g., radio frequency (RF), and the like) can be used as the transport medium between the external devices and communication port 774. Peripheral interface 754 interfaces the keyboard 750 and mouse 752, permitting input data to be transmitted to bus 756. In addition to these components, the control system also optionally includes an infrared transmitter (not shown) and/or infrared receiver (not shown). Infrared transmitters are optionally utilized when the computer system is used in conjunction with one or more of the processing components/stations that transmits/receives data via infrared signal transmission. Instead of utilizing an infrared transmitter or infrared receiver, the control system may also optionally use a low power radio transmitter 780 and/or a low power radio receiver 782. The low power radio transmitter transmits the signal for reception by components of the production process, and receives signals from the components via the low power radio receiver.

Figure 8:
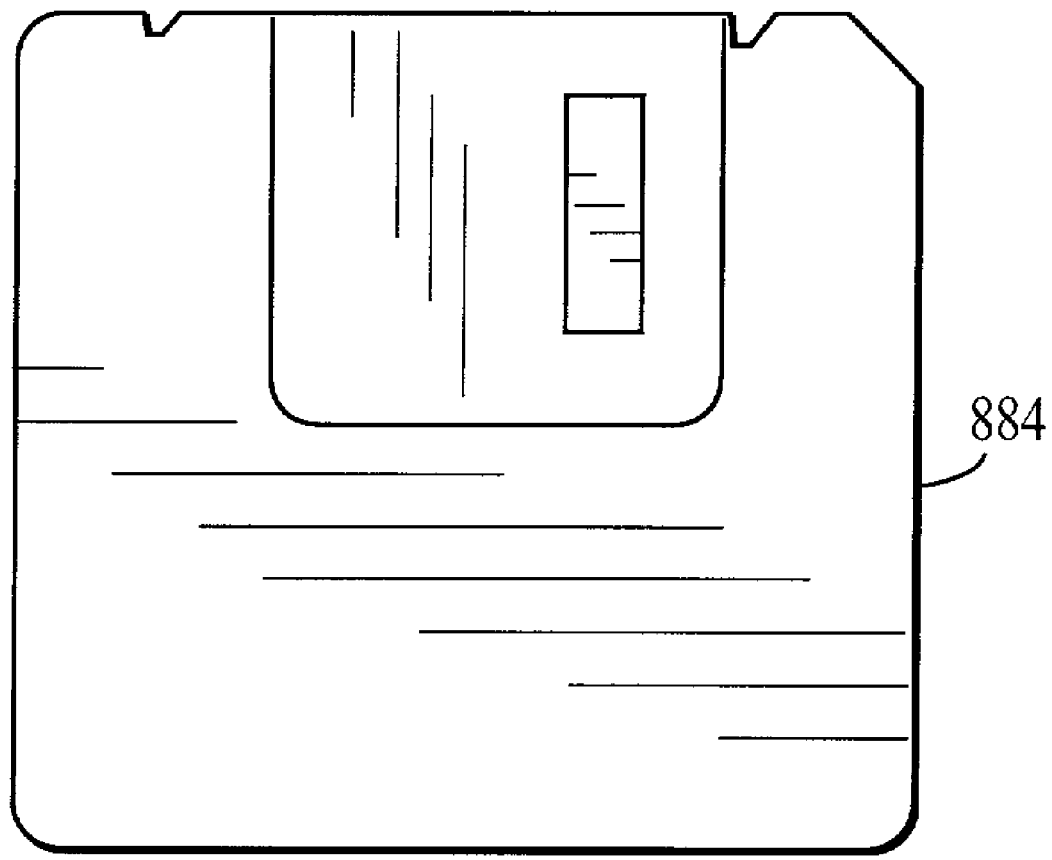
FIG. 8 illustrates one example of a memory medium which may be used for storing a computer implemented process of one or more embodiments of the present invention.

FIG. 8 is an illustration of an exemplary computer readable memory medium 884 utilizable for storing computer readable code or instructions including the model(s), recipe(s), etc). As one example, medium 884 may be used with disk drives illustrated in FIG. 7. Typically, memory media such as floppy disks, or a CD ROM, or a digital video disk will contain, for example, a multi-byte locale for a single byte language and the program information for controlling the above system to enable the computer to perform the functions described herein. Alternatively, ROM 760 and/or RAM 762 can also be used to store the program information that is used to instruct the central processing unit 758 to perform the operations associated with the instant processes. Other examples of suitable computer readable media for storing information include magnetic, electronic, or optical (including holographic) storage, some combination thereof, etc. In addition, one or more embodiments of the present invention contemplate that the computer readable medium can be a transmission.

Embodiments of the present invention contemplate that various portions of software for implementing the various aspects of the present invention as previously described can reside in the memory/storage devices.

In general, it should be emphasized that the various components of embodiments of the present invention can be implemented in hardware, software, or a combination thereof. In such embodiments, the various components and steps would be implemented in hardware and/or software to perform the functions of the present invention. Any presently available or future developed computer software language and/or hardware components can be employed in such embodiments of the present invention. For example, at least some of the functionality mentioned above could be implemented using C or C++ programming languages.

Further, it is to be understood that terms, such as "first" or "second," used in describing components, such as, for example, functional units and other components of the present invention herein (and in the claims), do not denote any form of order. Rather, such terms are used merely for convenience to differentiate between multiple and distinct components.

It is also to be appreciated and understood that the specific embodiments of the invention described hereinbefore are merely illustrative of the general principles of the invention. Various modifications may be made by those skilled in the art consistent with the principles set forth hereinbefore.

We claim:

1. A computer-implemented method for processing wafers, said method comprising the steps of:
   (1) receiving, at a first non tool level functional unit, one or more wafer characteristics;
   (2) generating, at the first non tool level functional unit, from the one or more wafer characteristics one or more tool targets for one or more tool level functional units;
   (3) forwarding said one or more tool targets from said first non tool level functional unit to said one or more tool level functional units; and
   (4) generating, at a tool level functional unit, from said one or more tool targets one or more tool recipes defining one or more process setpoints.

2. The method of claim 1, wherein said first non tool level functional unit comprises a fab.

3. The method of claim 1, wherein said first non tool level functional unit comprises a module.

4. The method of claim 1, wherein said one or more tool recipes are generated according to tool measurements of controlled parameters.

5. The method of claim 1, wherein said one or more tool targets are generated according to state information from at least one tool level functional unit other than said one or more tool level functional units.

6. The method of claim 1, wherein said one or more tool recipes are generated according to measurements of controlled parameters measured from a second non tool level functional unit or said tool level functional units.

7. The method of claim 1, wherein said one or more tool recipes are generated according to state information from a second non tool level functional unit or said tool level functional units.

8. The method of claim 1, further comprising utilizing a tool recipe of said one or more tool recipes corresponding to a first tool level functional unit in obtaining a tool final product associated with a second tool level functional unit.

9. The method of claim 1, further comprising:
   receiving, at a second non tool level functional unit, one or more wafer characteristics associated with said second non tool level functional unit;
   generating said one or more wafer characteristics for at least said first non tool level functional unit from the one or more wafer characteristics associated with said second non tool level functional unit; and
   forwarding said one or more wafer characteristics generated for said first non tool level functional unit from said second non tool level functional unit to said first non tool level functional unit.

10. The method of claim 1, wherein at least one tool level functional unit of said one or more tool level functional units includes an integrated metrology device or sensor for measuring controlled parameters.

11. The method of claim 1, wherein said one or more tool recipes are generated on a wafer to wafer basis.

12. The method of claim 1, wherein one or more models are used to generate said one or more tool targets.

13. The method of claim 1, wherein one or more models are used to generate said one or more tool recipes.

14. The method of claim 1, wherein one or more models are used to generate said one or more tool targets and wherein said one or more models are constructed utilizing design of experiment techniques.

15. The method of claim 1, wherein one or more models are used to generate said one or more tool targets and wherein said one or more models are constructed utilizing design constraints based on physical and/or empirical knowledge of said first non tool level functional unit or said tool level functional units.

16. The method of claim 1, wherein said wafer characteristics associated with said first non tool level functional unit are used to generate one or more wafer characteristics associated with a second non tool level functional unit, and wherein said one or more tool targets are generated by processing said one or more wafer characteristics associated with said second non tool level functional unit.

17. The method of claim 1, further comprising the step of:
(5) executing said one or more tool recipes on said one or more tool level functional units.

18. A system for processing wafers, said system comprising:
   a first non tool level functional unit comprising a controller capable of receiving one or more wafer characteristics associated with said first non tool level functional unit and generating one or more tool targets for one or more tool level functional units associated with said first non tool level functional unit;
   said one or more tool level functional units capable of receiving said one or more tool targets from said first non tool level functional unit and generating one or more tool recipes defining one or more process setpoints, by processing said one or more tool targets, wherein said one or more tool targets may be accomplished by attaining said one or more process setpoints.

19. The system of claim 18, further comprising an integrated metrology device or sensor for measuring controlled parameters.

20. The system of claim 18, further comprising:
a second non tool level functional unit comprising a controller capable of receiving one or more wafer characteristics associated with said second non tool level functional unit, generating said one or more tool targets for at least said first tool level functional unit from the wafer characteristics associated with said second non tool level functional unit, and forwarding said one or more tool targets generated by said second non tool level functional unit to said first non tool level functional unit.

21. The system of claim 18, wherein said one or more tool targets are generated according to state information from at least one tool level functional unit other than said one or more tool level functional units.

22. The system of claim 18, wherein said one or more tool recipes are generated according to measurements of controlled parameters measured from a second non tool level functional unit or said tool level functional units.

23. The system of claim 18, wherein said one or more tool recipes are generated according to state information from a second non tool level functional unit or said tool level functional units.

24. The system of claim 18, wherein a tool recipe of said one or more tool recipes corresponding to a first tool level functional unit in obtaining a tool final product is associated with a second tool level functional unit.

25. The system of claim 18, wherein said one or more tool recipes are generated according to tool measurements of controlled parameters.

26. The system of claim 18, wherein one or more models are used to generate said one or more tool targets and wherein said one or more models are constructed utilizing design constraints based on physical and/or empirical knowledge of said first non tool level functional unit or said tool level functional units.

27. The system of claim 18, further comprising a first non tool level functional unit controller for generating one or more wafer characteristics associated with a second non tool level functional unit, and wherein said one or more tool targets are generated by processing said one or more wafer characteristics associated with said second non tool level functional unit.

28. The system of claim 18, wherein said first non tool level functional unit comprises a fab.

29. The system of claim 18, wherein said first non tool level functional unit comprises a module.

30. A system for processing wafers, said system comprising:
means for receiving, at a first non tool level functional unit, one or more wafer characteristics associated with said first non tool level functional unit;
means for generating, at the first non tool level functional unit, from the one or more wafer characteristics one or more tool targets for one or more tool level functional units;
means for forwarding said one or more tool targets from said first non tool level functional unit to said one or more tool level functional units; and
means for generating, at a tool level functional unit, from said one or more tool targets one or more tool recipes defining one or more process setpoints.

31. The system of claim 30, further comprising means for measuring controlled parameters.

32. The system of claim 30, wherein said one or more tool targets are generated according to state information from at least one tool level functional unit other than said one or more tool level functional units.

33. The system of claim 30, wherein said one or more tool recipes are generated according to measurements of controlled parameters measured from a second non tool level functional unit or said tool level functional units.

34. The system of claim 30, wherein said one or more tool recipes are generated according to state information from a second non tool level functional unit or said tool level functional units.

35. The system of claim 30, further comprising means for utilizing a tool recipe of said one or more tool recipes corresponding to a first tool level functional unit in obtaining a tool final product associated with a second tool level functional unit.

36. The system of claim 30, further comprising:
means for receiving, at a second non tool level functional unit, one or more wafer characteristics associated with said second non tool level functional unit;
means for generating said one or more wafer characteristics for at least said first non tool level functional unit from said one or more wafer characteristics associated with said second non tool level functional unit; and
means for forwarding said one or more wafer characteristics generated for said first non tool level functional unit from said second non tool level functional unit to said first non tool level functional unit.

37. The system of claim 30, wherein one or more models are used to generate said one or more tool targets and wherein said one or more models are constructed utilizing design constraints based on physical and/or empirical knowledge of said first non tool level functional unit or said tool level functional units.

38. A computer readable medium for use in processing wafers, said computer readable medium comprising:
computer readable instructions for receiving, at a first non tool level functional unit, one or more wafer characteristics;
computer readable instructions for generating, at the first functional unit, from the one or more wafer characteristics one or more tool targets for one or more tool level functional units;
computer readable instructions for forwarding said one or more tool targets from said first functional unit to said one or more tool level functional units; and
computer readable instructions for generating, at a tool level functional unit, from said one or more tool targets one or more tool recipes defining one or more process setpoints.

39. The computer readable medium of claim 38, further comprising computer readable instructions for executing said one or more tool recipes on said one or more tool level functional units.

40. The computer readable medium of claim 38, wherein said one or more tool recipes are generated according to measurements of controlled parameters measured from a second non tool level functional unit or said tool level functional units.

41. The computer readable medium of claim 38, wherein said one or more tool recipes are generated according to state information from a second non tool level functional unit or said tool level functional units.

42. The computer readable medium of claim 38, further comprising computer readable instructions for utilizing a tool recipe of said one or more tool recipes corresponding to a first tool level functional unit in obtaining a tool final product associated with a second tool level functional unit.

43. The computer readable medium of claim 38, further comprising:

computer readable instructions for receiving, at a second non tool level functional unit, one or more wafer characteristics associated with said second non tool level functional unit;

computer readable instructions for generating said one or more tool targets for at least said first non tool level functional unit, by processing said one or more wafer characteristics associated with said second non tool level functional unit; and computer readable instructions for forwarding said one or more tool targets associated with said second non tool level functional unit to said first non tool level functional unit.

44. The computer readable medium of claim 38, further comprising computer readable instructions for measuring controlled parameters.

45. The computer readable medium of claim 38, wherein said one or more tool targets are generated according to state information from at least one tool level functional unit other than said one or more tool level functional units.

46. The method according to claim 1, wherein at least one of said one or more tool level functional units utilize feedback for use in optimizing subsequent runs.

* * * * *